(12) United States Patent
Suematsu

(10) Patent No.: US 10,790,589 B2
(45) Date of Patent: Sep. 29, 2020

(54) MICROWAVE DEVICE

(71) Applicant: SHARP KABUSHIKI KAISHA, Sakai, Osaka (JP)

(72) Inventor: Eiji Suematsu, Sakai (JP)

(73) Assignee: SHARP KABUSHIKI KAISHA, Sakai, Osaka (JP)

(*) Notice: Subject to any disclaimer, the term of this patent is extended or adjusted under 35 U.S.C. 154(b) by 27 days.

(21) Appl. No.: 16/293,277

(22) Filed: Mar. 5, 2019

(65) Prior Publication Data

US 2019/0280385 A1    Sep. 12, 2019

(30) Foreign Application Priority Data

Mar. 8, 2018 (JP) ................................ 2018-041895
Aug. 29, 2018 (JP) ................................ 2018-159841

(51) Int. Cl.
| | |
|---|---|
| *H01Q 9/04* | (2006.01) |
| *H01Q 13/08* | (2006.01) |
| *H01Q 21/06* | (2006.01) |
| *H01Q 1/22* | (2006.01) |
| *H01Q 21/24* | (2006.01) |
| *H01L 23/66* | (2006.01) |

(52) U.S. Cl.
CPC .......... *H01Q 9/0407* (2013.01); *H01L 23/66* (2013.01); *H01Q 1/2283* (2013.01); *H01Q 13/08* (2013.01); *H01Q 21/061* (2013.01); *H01Q 21/065* (2013.01); *H01Q 21/24* (2013.01); *H01L 2223/6627* (2013.01)

(58) Field of Classification Search
None
See application file for complete search history.

(56) References Cited

U.S. PATENT DOCUMENTS

| | | | |
|---|---|---|---|
| 10,355,347 B2* | 7/2019 | Suematsu | ................ H01P 3/06 |
| 2016/0322714 A1* | 11/2016 | Ying | ...................... H01Q 21/30 |
| 2019/0067813 A1* | 2/2019 | Igura | ...................... H01Q 21/22 |
| 2019/0326676 A1* | 10/2019 | Suematsu | .............. H01Q 21/08 |

FOREIGN PATENT DOCUMENTS

| | | |
|---|---|---|
| JP | H07-066627 A | 3/1995 |
| JP | 2007-013531 A | 1/2007 |

* cited by examiner

*Primary Examiner* — Jany Richardson
(74) *Attorney, Agent, or Firm* — ScienBiziP, P.C.

(57) ABSTRACT

A microwave device includes a board having a first face and a second face, a transmitting antenna portion provided on the first face, a receiving antenna portion provided on the first face, and a high-frequency circuit portion that is provided on the first face and is connected to the transmitting antenna portion and the receiving antenna portion. The microwave device further includes, on the second face of the board, a ground face that is provided shared by the transmitting antenna portion, receiving antenna portion, and high-frequency circuit portion, and a via hole connecting another ground face of the high-frequency circuit portion and the ground face. A ground face shared by the transmitting antenna portion, receiving antenna portion, and high-frequency circuit portion is configured by the ground faces and the via hole.

15 Claims, 31 Drawing Sheets

⟨PLAN VIEW⟩

⟨CROSS-SECTIONAL VIEW ALONG d-d'⟩

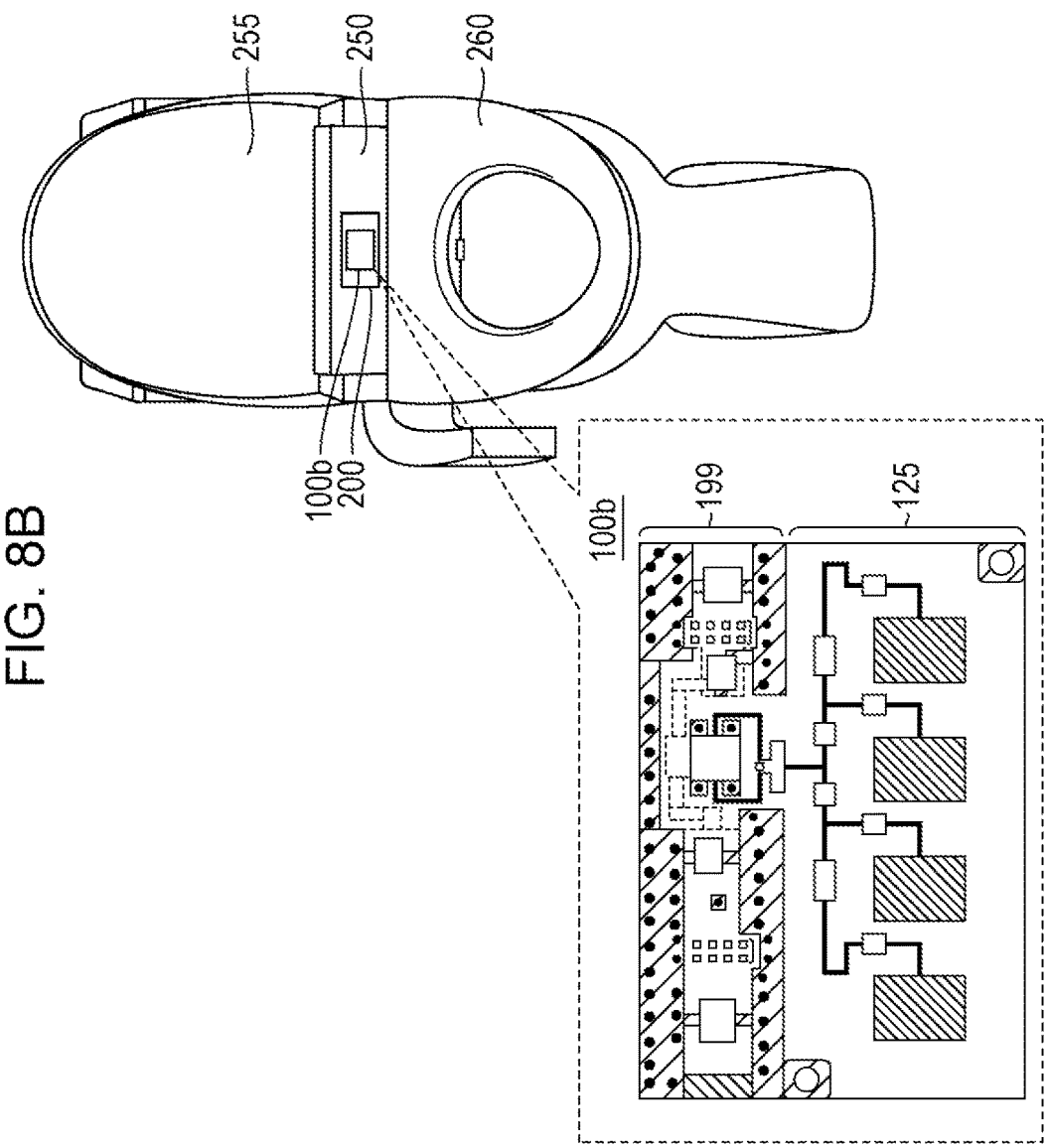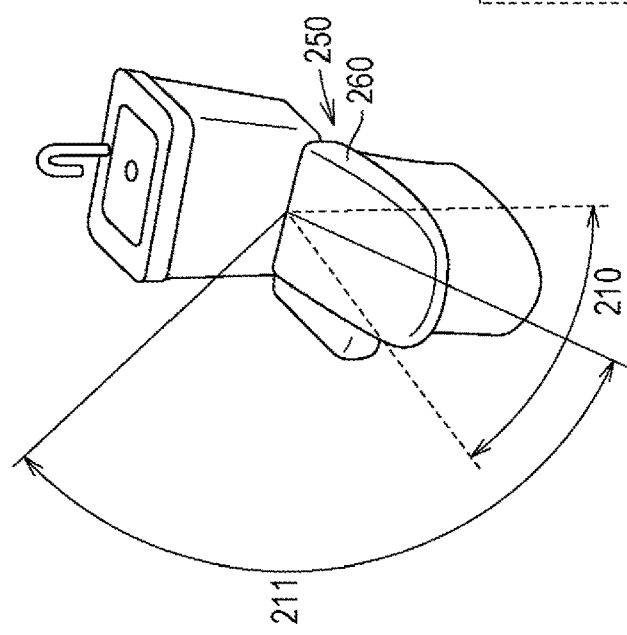

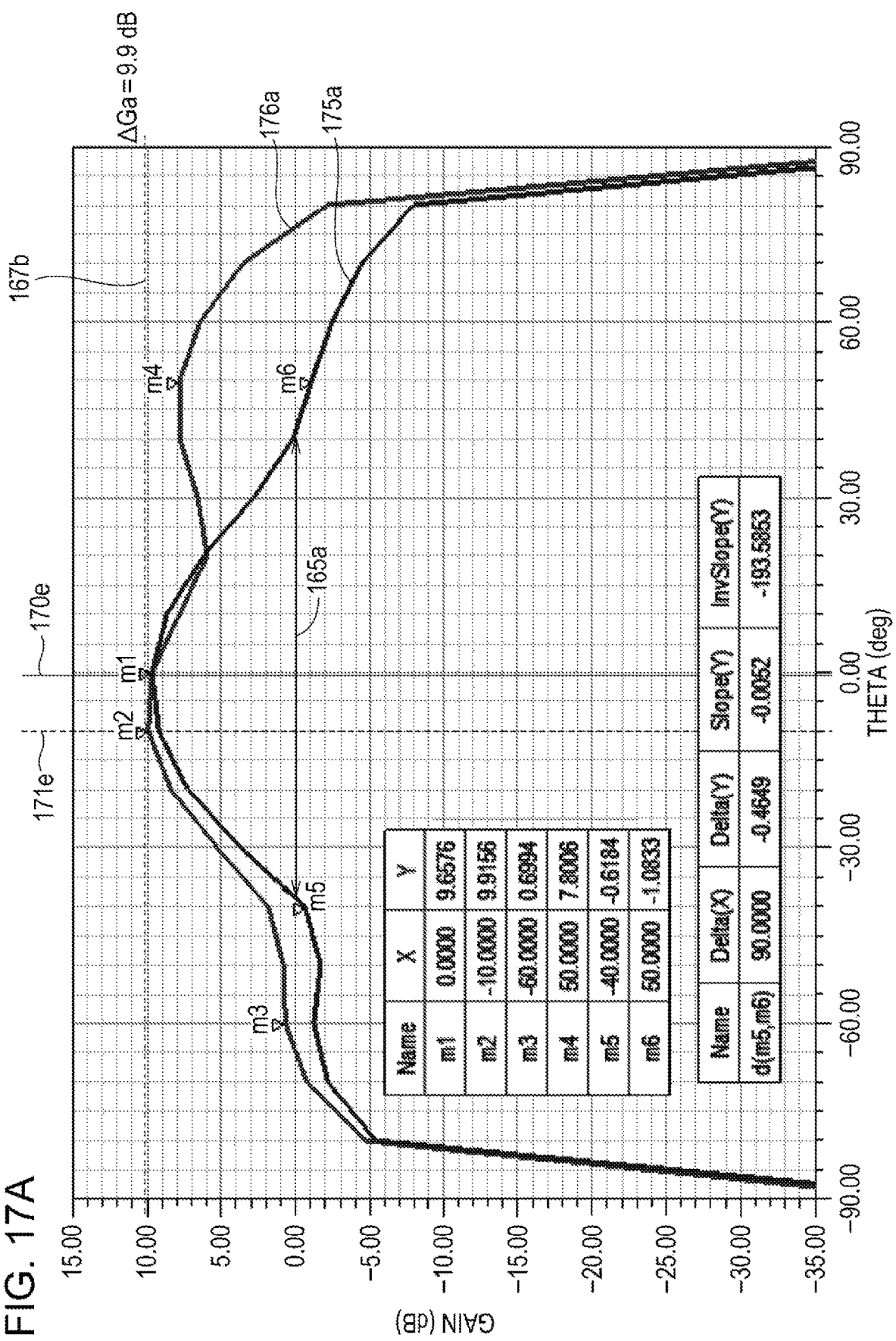

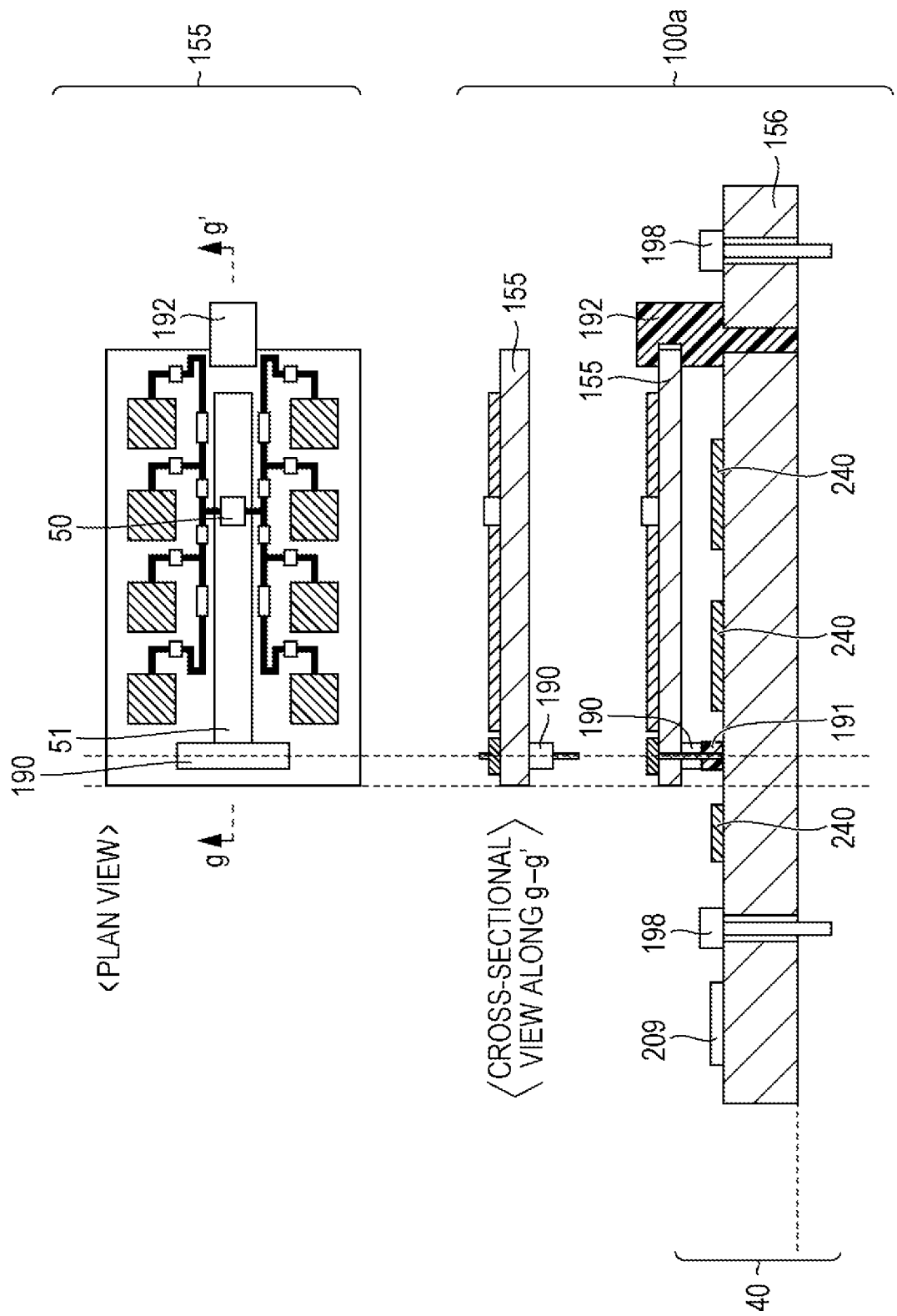

MICROWAVE DEVICE

BACKGROUND

1. Field

The present disclosure relates to a microwave device.

2. Description of the Related Art

Japanese Unexamined Patent Application Publication 7-66627, for example, discloses an example of a flat patch antenna device that is a conventional microwave device.

FIG. 23 is a diagram illustrating a schematic configuration of technology disclosed in Japanese Unexamined Patent Application Publication 7-66627. A flat patch antenna device 400 includes an antenna board 410, an antenna patch electrode 420 provided to one face of the antenna board 410, a circuit board 450, a circuit pattern 460 formed on one face of the circuit board 450, and a ground electrode 438. By overlaying a ground electrode provided on the other face of the antenna board 410 and a ground electrode provided on the other face of the circuit board 450, the ground electrode 438 is supplied to the antenna board 410 and the circuit board 450, and the antenna board 410 and circuit board 450 are layered as to each other.

A through hole 440 of the antenna board 410 side and a through hole 490 of the circuit board 450 side conduct with each other. The through holes 440 and 490 are electrically connected by a through hole conductor 440a at the antenna board 410 side and a through hole conductor 490a at the circuit board 450 side. Accordingly, the antenna patch electrode 420 at the antenna board 410 side and a circuit unit including the circuit pattern 460 at the circuit board 450 side are electrically connected.

According to the above-described configuration, the flat patch antenna device 400 including the flat patch antenna and the circuit unit connected thereto can be reduced in size and thickness. Further, no cables have to be used to connect the antenna and circuit unit, so the number of parts and the number of procedures can be reduced.

For example, Japanese Unexamined Patent Application Publication No. 2007-13531 discloses a flat patch antenna device having a different configuration. FIGS. 24a and 24B are diagrams illustrating a schematic configuration of technology disclosed in Japanese Unexamined Patent Application Publication No. 2007-13531. FIG. 24A is a disassembled perspective view of the antenna device disclosed in Japanese Unexamined Patent Application Publication No. 2007-13531. FIG. 24B is a perspective view of the antenna device disclosed in Japanese Unexamined Patent Application Publication No. 2007-13531, in perspective view from the rear face side.

The antenna device has a dielectric board 1000 and a shielding member 2000, as illustrated in FIGS. 24a and 24B. A high-frequency circuit unit and low-frequency circuit unit (sub-board 1800) are mounted on one face 1000b of the dielectric board 1000. Formed on the other face 1000a of the dielectric board 1000 are a transmitting side patch array antenna 1100 and receiving side patch array antenna 1200, electric power supply lines 1310 and 1320 distributively connected to the patch array antennas, and high-frequency connecting lines 1410 through 1450 connected to the high-frequency circuit. The shielding member 2000 is provided on the face 1000a of the dielectric board 1000, covering at least part of the electric power supply lines and high-frequency connecting lines. Screws 3000 mechanically fix the shielding member 2000 and the dielectric board 1000 to each other. Thus, the shielding member 2000 and a ground pattern 1500 come into contact.

An opening 2100 for exposing the transmitting side patch array antenna and an opening 2200 for exposing the receiving side patch array antenna are separately provided to the shielding member 2000. Accordingly, the transmitting side patch array antenna and the receiving side patch array antenna are separated by the shielding member 2000, so waves directly input from the transmitting side patch array antenna 1100 to the receiving side patch array antenna 1200 can be reduced.

Further, the one face 1000b of the dielectric board 1000 is provided with ground patterns 1710 through 1740 surrounding the high-frequency circuit. Providing a conductive shield case in contact with these ground patterns enables the high-frequency circuit to be covered by the shield case. Accordingly, unwanted radiation emitting from the high-frequency circuit can also be effectively shielded.

However, according to the configuration disclosed in Japanese Unexamined Patent Application Publication 7-66627, the circuit unit and flat patch antenna are connected by the through hole conductors, so there is a difficulty in that high-frequency impedance tends to become unstable. As one example, it is difficult with the above-described configuration to stabilize high-frequency impedance to 50-ohm characteristic impedance generally used in the microwave band. Accordingly, unwanted radiation occurs at the connection portion between the through hole conductor and circuit unit or antenna. As a result, high-frequency wave loss is great, and signals are not supplied to the antenna element in a uniform and stable manner. This leads to reduced radiation efficiency of the antenna, or frequent enlargement of sidelobes due to breakdown of radiation pattern.

In addition, when reducing the size of the above-described flat antenna device, even if the size of the antenna itself can be reduced, a ground face having sufficient area is not secured. This leads to a problem in that in a case of installing the antenna device with reduced size in equipment, an installation, etc., the antenna radiation properties may be markedly deviated from the original radiation properties due to backward radiation, and further due to the effects of equipment or installations in the vicinity.

Moreover, a thick board has to be used to increase the radiation efficiency of the flat antenna unit. However, using a thick board increases the length (line length) of the through hole conductor connecting the antenna unit and circuit unit. A longer through hole conductor increases loss for the high-frequency line length of the through hole conductor, and high-frequency impedance becomes unstable as well. Accordingly, deterioration in antenna efficiently and unwanted radiation occur more readily.

Japanese Unexamined Patent Application Publication No. 2007-13531 also discloses a configuration the same as the configuration disclosed in Japanese Unexamined Patent Application Publication 7-66627. The transmitting side patch array antenna 1100 and receiving side patch array antenna 1200, and electric power supply lines 1310 and 1320 are formed on the face 1000a of the dielectric board 1000. The face 1000b on the opposite side of the dielectric board 1000 is the face where the high-frequency circuit unit (oscillator circuit 1610, output circuit 1620, low noise amplifier (LNA) 1630, mixer circuit 1640, etc.) is mounted. The high-frequency circuit unit and the patch antennas are connected by high-frequency connecting lines 1420 and 1430 that include through hole electrodes. As a result, a problem the same as the problem in the flat patch antenna device disclosed in Japanese Unexamined Patent Application Publication 7-66627 occurs. The dielectric board 1000 has to have a size in both the vertical and lateral directions several times the size of the patch array antennas, so the dielectric board 1000 has to be a board of a sufficiently large area. In other words, it is difficult to realize a flat antenna device using a small-size dielectric board by the configuration disclosed in Japanese Unexamined Patent Application Publication No. 2007-13531.

Further, ground conductors 1710 through 1740 are formed on the face 1000b of the dielectric board 1000 at the opposite side from the face where the transmitting side patch array antenna 1100 and receiving side patch array antenna 1200 are formed. However, the ground conductors are only present around the high-frequency circuit. In principle, a microstrip line patch antenna is configured with a patch antenna formed on one face of a board, and ground conductors formed on the other face of the board. Strictly speaking, the antenna disclosed in Japanese Unexamined Patent Application Publication No. 2007-13531 is not a microstrip line patch antenna. Accordingly, there is a possibility that radio waves will leak from the transmitting side patch array antenna 1100 and receiving side patch array antenna 1200 to the face on the side where the high-frequency circuit is mounted. Alternatively, there is a possibility of characteristic impedance on lines will become unstable at the electric power supply lines 1310 and 1320 or high-frequency connecting lines 1420 and 1430. Thus, the antenna device disclosed in Japanese Unexamined Patent Application Publication No. 2007-13531 may exhibit unstable operation.

It has been found desirable to provide a microwave device that is small in size and has excellent radiation properties.

SUMMARY

According to an aspect of the disclosure, there is provided a microwave device, including: a first board having a first face and a second face; a transmitting antenna portion provided on the first face; a receiving antenna portion provided on the first face; a high-frequency circuit portion that is provided on the first face, and that is connected to the transmitting antenna portion and the receiving antenna portion, the high-frequency circuit portion being disposed between the transmitting antenna portion and the receiving antenna portion and including a first ground face, a circuit part, and a line; and a second ground face that is provided on the second face of the first board and is shared by the transmitting antenna portion, the receiving antenna portion, and the high-frequency circuit portion. A via hole is provided connecting the first ground face and the second ground face of the high-frequency circuit portion. The first ground face, the second ground face, and the via hole, form a ground face that is shared by the transmitting antenna portion, the receiving antenna portion, and the high-frequency circuit portion.

According to an aspect of the disclosure, there is provided a microwave device, including: a first board having a first face and a second face; a transmitting/receiving antenna portion that is provided on the first face and that is shared by the transmitting antenna portion and the receiving antenna portion, and that has an electric power supply unit; a high-frequency circuit portion that is provided on the first face along with the transmitting/receiving antenna portion and that is connected to the transmitting/receiving antenna portion, the high-frequency circuit portion including a first ground face, a circuit part, a line, a transmission terminal, and a reception terminal; and a second ground face that is provided on the second face of the first board and is shared by the transmitting/receiving antenna portion and the high-frequency circuit portion. The electric power supply unit of the transmitting/receiving antenna portion and the transmission terminal and reception terminal of the high-frequency circuit portion are connected by a power coupler having inter-terminal isolation or a branch line coupler having directionality. A via hole is provided connecting the first ground face and the second ground face of the high-frequency circuit portion. The first ground face, the second ground face, and the via hole, form a ground face that is shared by the transmitting/receiving antenna portion and the high-frequency circuit portion.

According to an aspect of the disclosure, there is provided a microwave device, including: a first board having a first face and a second face; a transmitting antenna portion provided on the first face; a receiving antenna portion provided on the first face; a high-frequency circuit portion that is provided on the first face, and that is connected to the transmitting antenna portion and the receiving antenna portion, the high-frequency circuit portion being disposed between the transmitting antenna portion and the receiving antenna portion and including a first ground face, a circuit part, and a line; and a second ground face that is provided on the second face of the first board and is shared by the transmitting/receiving antenna portion and the high-frequency circuit portion. The transmitting antenna portion and receiving antenna portion are configured with an interval between respective power supply points is $0.7\lambda$ to $2\lambda$ (where $\lambda$ represents the wavelength of microwaves in air). A via hole is provided connecting the first ground face and the second ground face of the high-frequency circuit portion. The first ground face, the second ground face, and the via hole, form a ground face that is shared by the transmitting antenna portion, the receiving antenna portion, and the high-frequency circuit portion.

BRIEF DESCRIPTION OF THE DRAWINGS

FIGS. 8A and 8B are diagrams illustrating a specific application example of the microwave device according to the second embodiment;

FIGS. 17A and 17B are diagrams illustrating a radiation pattern of antenna characteristics according to the fourth embodiment, in a case where a distance Lc between a patch edge and a ground face at an edge of the board is 3 mm (0.3λ);

FIG. 21 is a diagram illustrating the configuration of a microwave device according to a sixth embodiment;

DESCRIPTION OF THE EMBODIMENTS

Figure 1:
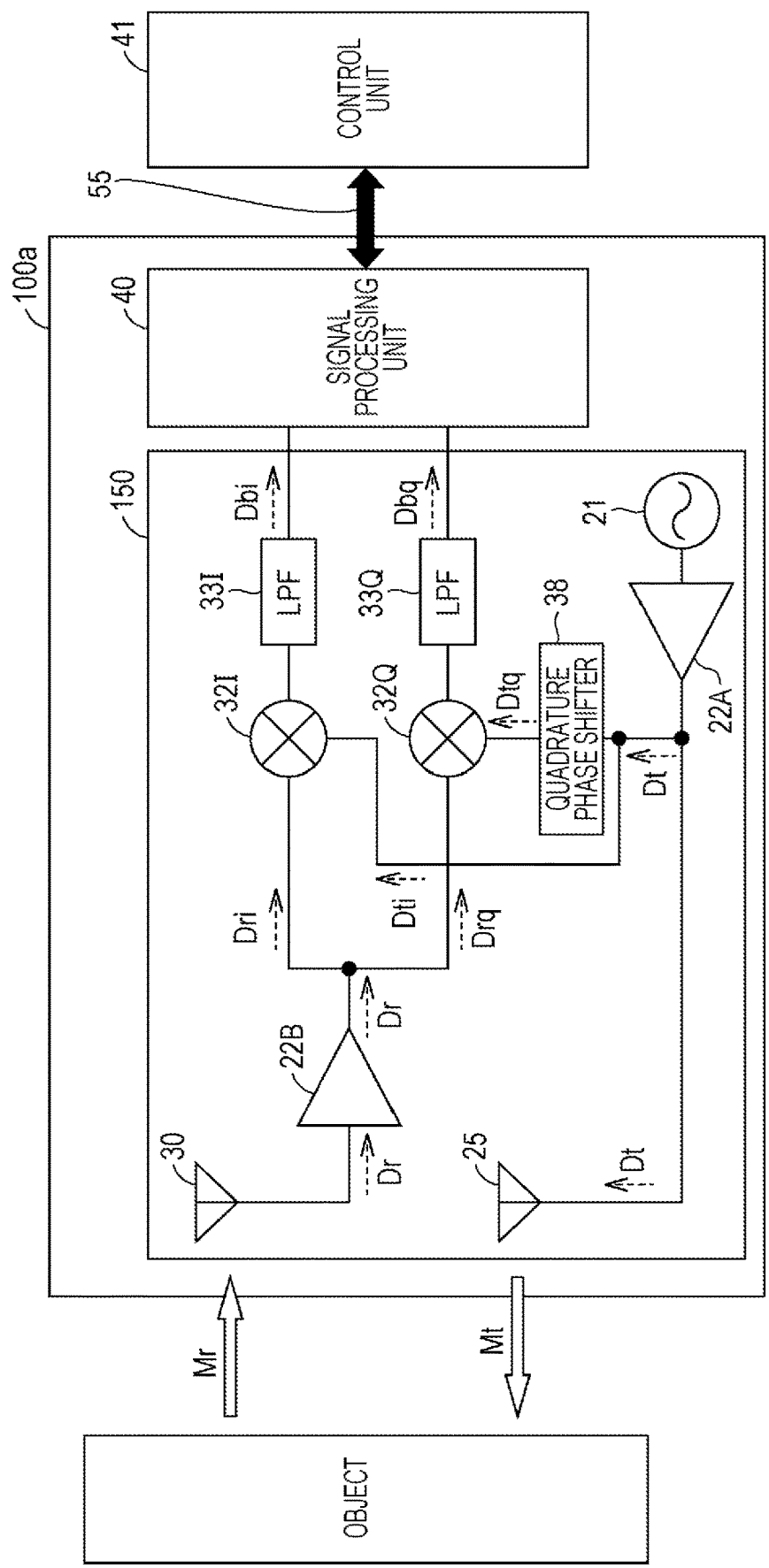
FIG. 1 is a block diagram illustrating the configuration of a microwave device according to a first embodiment.

Embodiments of the present disclosure will be described below with reference to the drawings. In the following description, parts which are the same are denoted by the same reference numerals. The names and functions thereof are also the same. Accordingly, repetitive description thereof will not be made in detail.

First Embodiment

Figure 2:
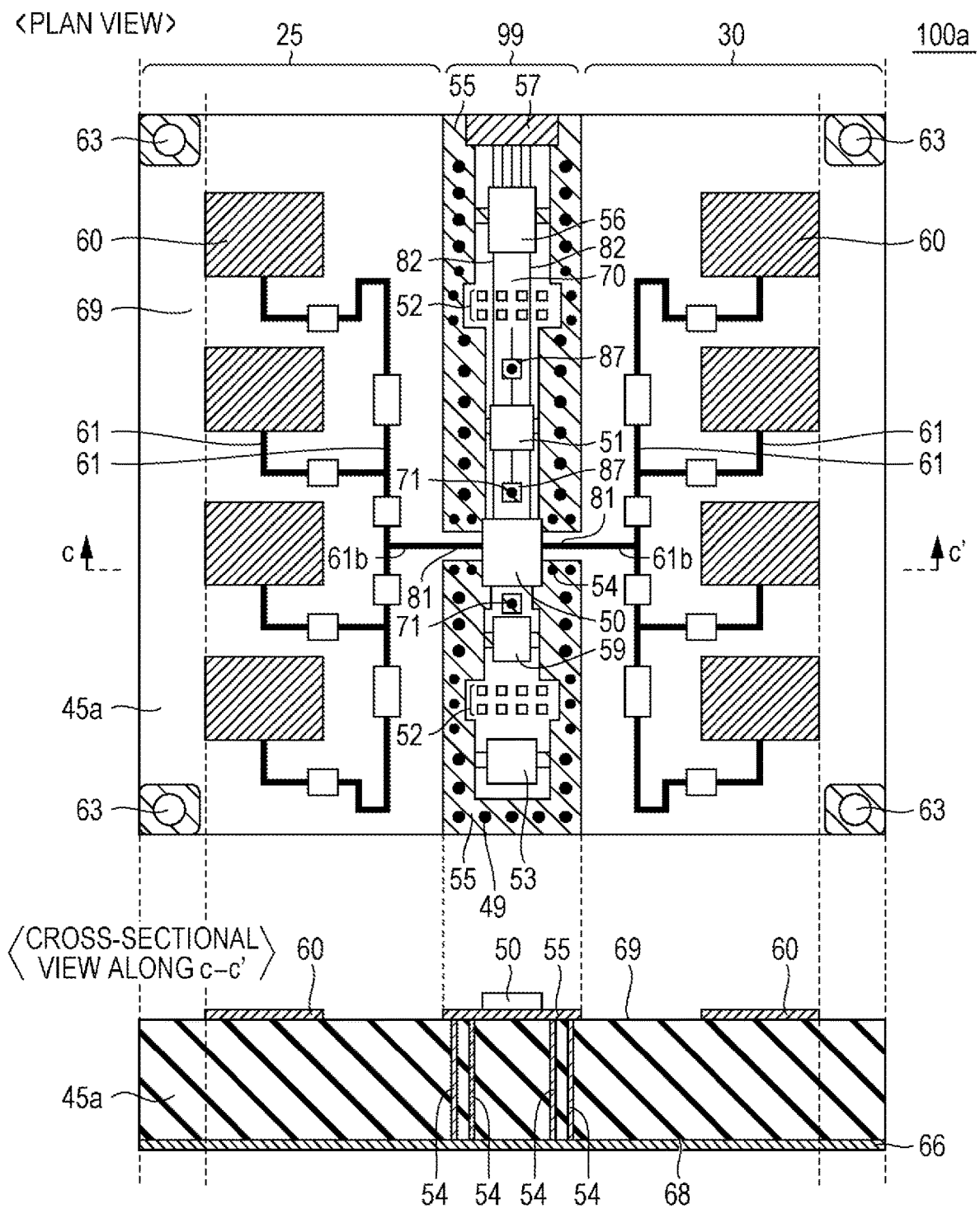
FIG. 2 is a diagram illustrating a first face of a board applied to the microwave device according to the first embodiment, and a cross-sectional view of the board.

A first embodiment of the present disclosure will be described below.
Circuit Block FIG. 1 is a block diagram illustrating the configuration of a microwave device 100a according to the first embodiment. FIG. 2 is a diagram illustrating a first face of a board applied to the microwave device 100a according to the first embodiment, and a cross-sectional view of the board.

The microwave device 100a according to the first embodiment has, as some components, a signal processing unit 40 and a microwave doppler sensor 150, as illustrated in FIGS. 1 and 2. The signal processing unit 40 and the microwave doppler sensor 150 may be mounted on a single board 45a. The signal processing unit 40 may be provided on a separate board from the board on which the circuit portion of the microwave doppler sensor 150 is provided, to reduce the size of the microwave device 100a.

The microwave doppler sensor 150 emits microwaves to an object, and from the reflected microwaves, outputs signals reflecting the object or the like to the signal processing unit 40. The microwave doppler sensor 150 also generates mutually orthogonal I channel signals and Q channel signals from the input reflected waves (reflection signals).

Specifically, the microwave doppler sensor 150 includes an oscillator circuit 21, amplifiers 22A and 22B, a transmitting antenna portion 25, a receiving antenna portion 30, mixers 32I and 32Q, low-pass filters (LPF) 33I and 33Q, and a quadrature phase shifter 38. The circuit portion of the microwave doppler sensor 150 has been integrated as a radio frequency integrated circuit (RFIC) 50, as illustrated in FIG. 2. However, the circuit portion may be configured of individual parts, such as high-frequency transistors, diodes, and so forth.

FIG. 2 illustrates the layout of the microwave device 100a on the circuit board, and the layout configuration of circuit parts. With reference to FIG. 2, a high-frequency circuit portion 99 is a circuit portion having a configuration where the circuit portion of the microwave doppler sensor 150 illustrated in FIG. 1, the signal processing unit 40, and the power source circuit portion and so forth have been integrated. Note that the signal processing unit 40 may be provided on a separate board, to reduce the size of the microwave device 100a, as described above.

Separately from the high-frequency circuit portion 99, the transmitting antenna portion 25 and receiving antenna portion 30 are provided on the board 45a (first board). The transmitting antenna portion 25 and receiving antenna portion 30 are both configured of flat antennas. The transmitting antenna portion 25 and receiving antenna portion 30 may be configured of waveguide antennas or dielectric antennas. The transmitting antenna portion 25 and receiving antenna portion 30 are electrically connected to the high-frequency circuit portion 99.

The operations of the high-frequency circuit portion 99, transmitting antenna portion 25, and receiving antenna portion 30 will be described below (see FIGS. 1 and 2). Microwave sine wave signals output from the oscillator circuit 21 are amplified by the amplifier 22A, and emitted from the transmitting antenna portion 25. Microwaves Mt emitted into space are reflected at an object, for example at the body surface (e.g., chest) of a subject that is a living body. Doppler frequency and phase corresponding to the movement of the body of the subject (bodily motion), and respiratory actions and cardiac actions, occur in reflected waves Mr of the emitted microwaves. Accordingly, the signals of the reflected waves Mr (reflection signals) input to the receiving antenna portion 30 are signals corresponding to the bodily motion, and respiratory actions and cardiac actions of the subject.

The reflection signals received by the receiving antenna portion 30 are amplified by the amplifier 22B. The post-amplification signals Dr are input to the I-channel side mixer 32I and Q-channel side mixer 32Q. For sake of convenience here, the signals Dr input to the I-channel side will be referred to as "Dri", and the signals Dr input to the Q-channel side will be referred to as "Drq".

The signals Dt amplified by the amplifier 22A are input to the I-channel side mixer 32I, and to the mixer 32Q via the quadrature phase shifter 38. For sake of convenience here, the signals Dt input to the I-channel side will be referred to as "Dti", and the signals Dt input to the Q-channel side will be referred to as "Dtq". Although a configuration where the phase of the signals Dtq is shifted by 90 degrees as to the signals Dti by using the quadrature phase shifter 38 will be described in the present embodiment, this configuration is not restrictive. For example, a configuration may be made where the phase of the signals Drq is shifted by 90 degrees as to the signals Dri by using the quadrature phase shifter 38 at the input side of the mixer 32Q.

The signals that have been frequency-converted (down-converted) by the mixer 32I are input to the LPF 33I. The LPF 33I removes relatively high frequency components from these signals, and outputs the resulting signals to the signal processing unit 40 as I-channel side baseband signals Dbi. The signals that have been frequency-converted at the mixer 32Q are input to the LPF 33Q. The LPF 33Q removes relatively high frequency components from these signals, and outputs the resulting signals to the signal processing unit 40 as Q-channel side baseband signals Dbq. These baseband signals Dbi and Dbq are each output as signals including doppler frequency and phase due to bodily motion of the subject.

The velocity and amplitude of reflection signals input to the receiving antenna portion 30 change over time. Accordingly, although the I-channel side signals and Q-channel side signals momentarily have phase difference of 90 degrees, the advance of phase of the baseband signals Dbq as to the baseband signals Dbi is not the same, depending on the velocity and direction of the signals, and continuously varies over time.

Configuration of Antenna-Integrated Microwave Device

The plan view in FIG. 2 illustrates the layout of a first face 69 of the board 45a in the microwave device 100a according to the first embodiment. At the first face 69 of the board 45a, the transmitting antenna portion 25 and receiving antenna portion 30 are configured as flat antennas at the left and right areas of the board 45a, and the high-frequency circuit portion 99 is configured at the middle area of the board 45a. That is to say, the high-frequency circuit portion 99 is disposed between the transmitting antenna portion 25 and receiving antenna portion 30 on the first face 69 of the board 45a.

In the present embodiment, the transmitting antenna portion 25 and receiving antenna portion 30 are configured of flat antennas having the same shape. In one example, the flat antennas are flat antennas that each are configured having four antenna patch element portions 60. Each antenna patch element portions 60 is a microstrip patch antenna. The transmitting antenna portion 25 and receiving antenna portion 30 are each configured including four antenna patch element portions 60 and an electric power supply line (microstrip line 61) including a rectifying circuit. Input/output lines (microstrip lines 61b) of the transmitting antenna portion 25 and receiving antenna portion 30 are connected to the RFIC 50 that is a part included in the high-frequency circuit portion 99.

The high-frequency circuit portion 99 is configured including the RFIC 50, power source IC 53, oscillator control part 59 and LCR (indictor, capacitor, resistor) parts 52 for the RFIC, op-amp/comparator 51 and microprocessor 56 for analog signal processing (including A/D conversion part), and LCR parts 52 related thereto. The components are wired by wiring 70. Only principal lines relating to the present disclosure are illustrated as wiring 70 in FIG. 2.

A ground face 55 (first ground face) is provided on the first face 69 of the board 45a (first board). The ground face 55 is electrically connected to a ground face provided on the second face of the board 45a by multiple via holes 49. FIG. 2 illustrates a cross-sectional view of the board 45a taken along line c-c' in the plan view. The ground face 55 of the first face 69, and a ground face 66 of the second face 68, are electrically connected by multiple via holes 54, as illustrated in the cross-sectional view, whereby the high-frequency impedance between the ground face 55 and the ground face 66 is approximately 0Ω. The ground face 55 on the first face and ground face 66 on the second face make up a high-frequency ground face shared by the high-frequency circuit portion 99, transmitting antenna portion 25, and receiving antenna portion 30.

The microwave device 100a according to the first embodiment is configured using both faces of a single board 45a, as illustrated in FIG. 2. The transmitting antenna portion 25, receiving antenna portion 30, and high-frequency circuit portion 99 are configured on the same face (first face 69) of the board 45a, so connection thereof by through holes is unnecessary. The input/output impedance of the signal line portion (microstrip line 61b) of the antenna power supply portion can be stably maintained at 50Ω as one example, which is generally used with high frequency, so impedance matching at the connection between the transmitting antenna portion 25 and high-frequency circuit portion 99, and impedance matching at the connection between the receiving antenna portion 30 and high-frequency circuit portion 99, is more readily secured. Accordingly, high-frequency loss is reduced, so uniform and stable signals are supplied from the high-frequency circuit portion 99 to the transmitting antenna portion 25, and from the receiving antenna portion 30 to the high-frequency circuit portion 99. The radiation efficiency of the antenna portions (a collective reference to the transmitting antenna portion 25 and receiving antenna portion 30) can be maintained at high efficiency, and effects of unwanted radiation and so forth from the electric power supply portion can be reduced.

Further, the ground face 55 is formed on the first face 69 of the board 45a, in addition to the layout pattern of the high-frequency circuit portion 99, transmitting antenna portion 25, and receiving antenna portion 30. On the other hand, the ground face 66, which is the ground face of the transmitting antenna portion 25 and receiving antenna portion 30, and also is the ground face of the high-frequency circuit portion 99, is formed on the second face 68 that is the rear face of the board 45a. The ground face 55 and ground face 66 are connected by via holes 54. Accordingly, a common ground face can be formed for the transmitting antenna portion 25, receiving antenna portion 30, and high-frequency circuit portion 99. This ground face forms a stable high-frequency ground face, so each of the transmitting antenna portion 25, receiving antenna portion 30, and high-frequency circuit portion 99 can maintain high-performance and stable operations.

There is a possibility of there being portions not suitable for wiring on the first face 69, due to the input/output lines for the RFIC 50 and so forth. A configuration such as illustrated in FIG. 3, for example, can be employed to handle this problem.

Figure 3:
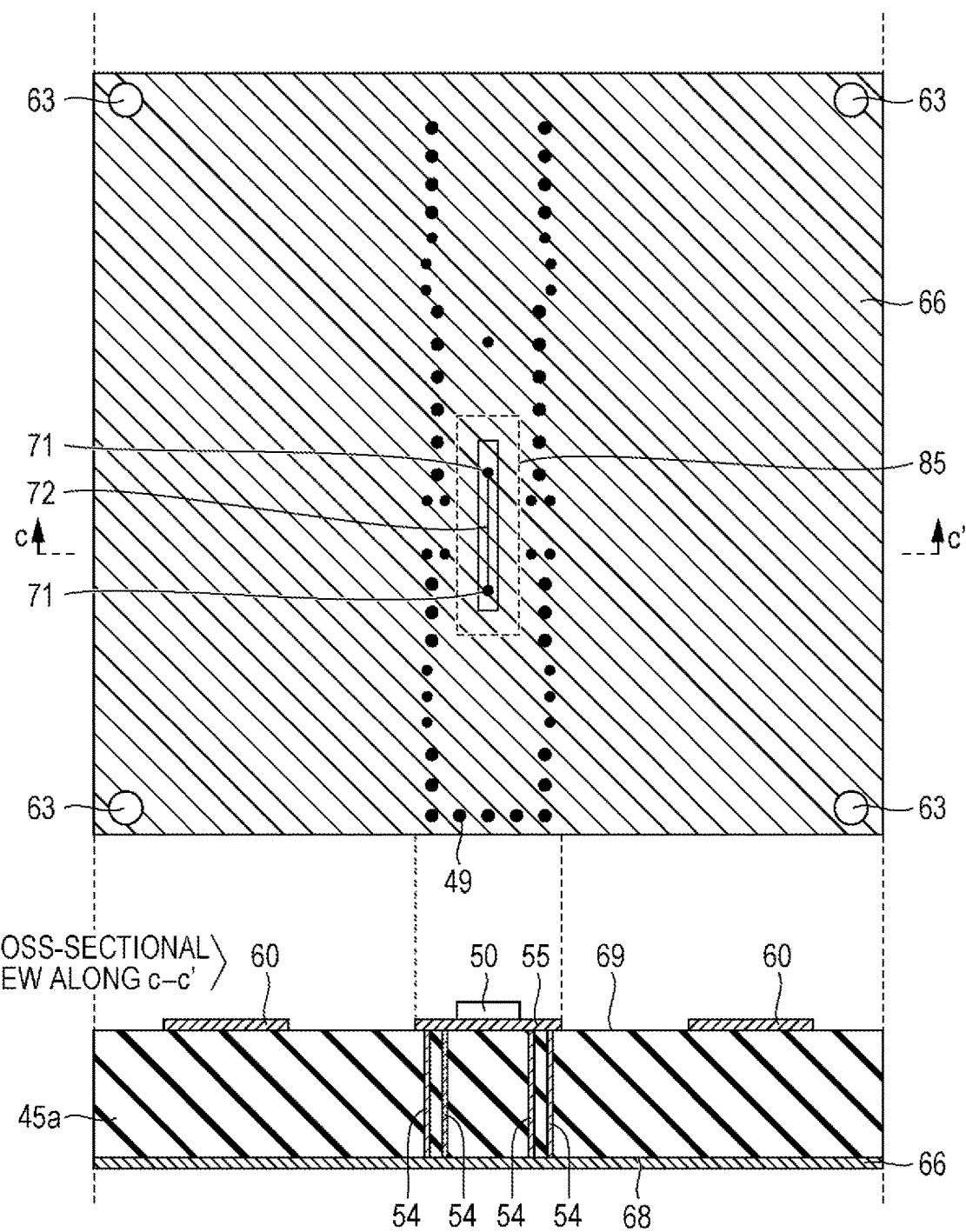
FIG. 3 is a diagram illustrating the configuration of a rear face (second face) of the board.

FIG. 3 is a diagram illustrating the configuration of the rear face (second face 68) of the board 45a. A part of the area of the ground face 66 is eliminated, as illustrated in FIG. 3. Ends of two through hole lines 71 on the second face 68 side, and a wiring portion 72 are laid out in this area. The wiring portion 72 connects the ends of the two through hole lines 71 to each other on the second face 68 side. The ends of the two through hole lines 71 on the first face 69 side are connected to wiring portions or circuit portions, and are connected to another board by an output connector 57 (see FIG. 2). Note that a resist portion 85 illustrated in FIG. 3 will be described later.

FIG. 3 illustrates a cross-sectional view of the board 45a taken along line c-c' in the plan view. The line c-c' is the same as the line c-c' in the plan view in FIG. 2. That is to say, the cross-sectional view of the board 45a illustrated in FIG. 2 is also illustrated in FIG. 3.

Figure 4A:
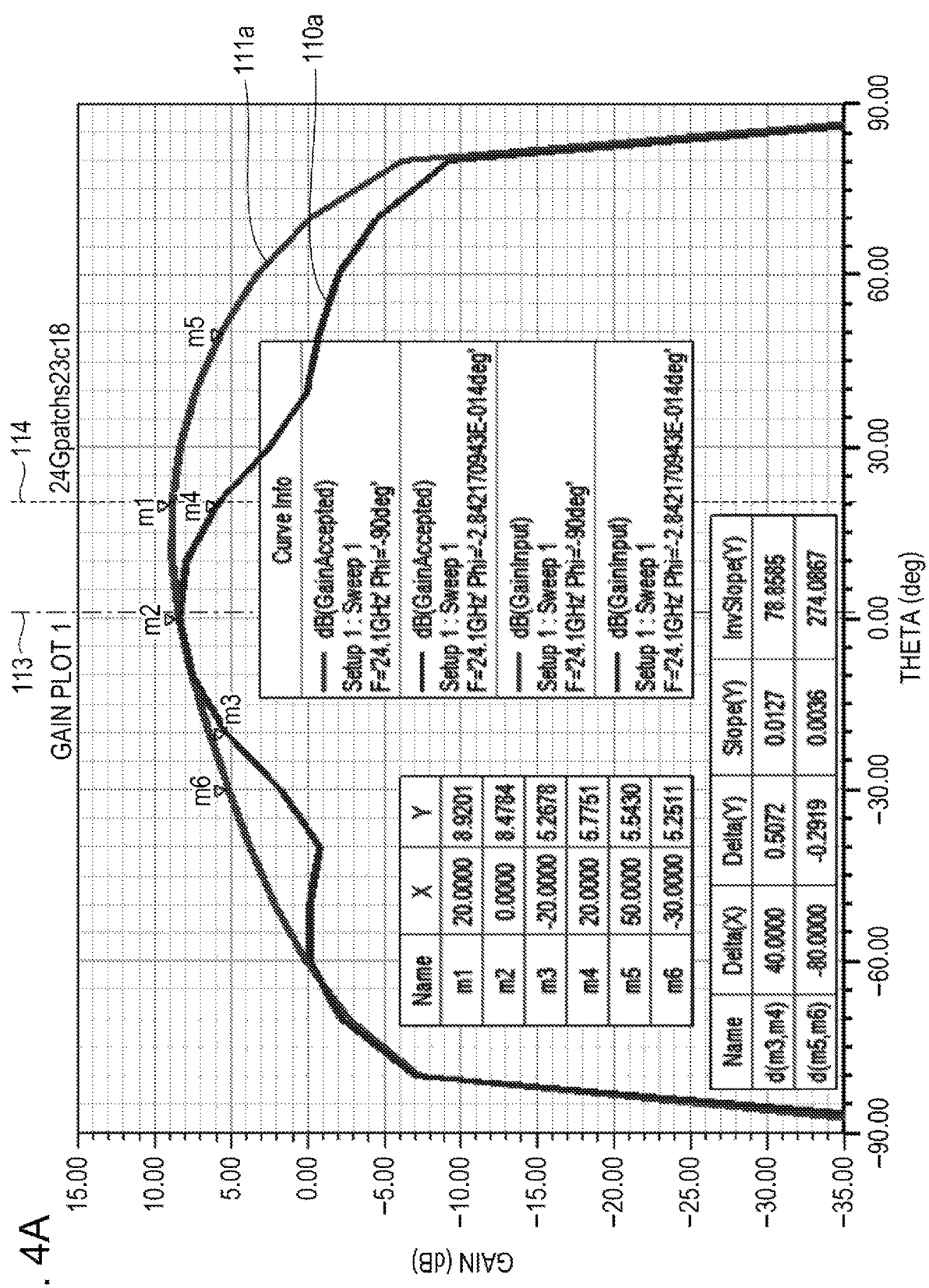
FIGS. 4A and 4B are diagrams illustrating directionality characteristics of a flat antenna according to the first embodiment.
Figure 4B:
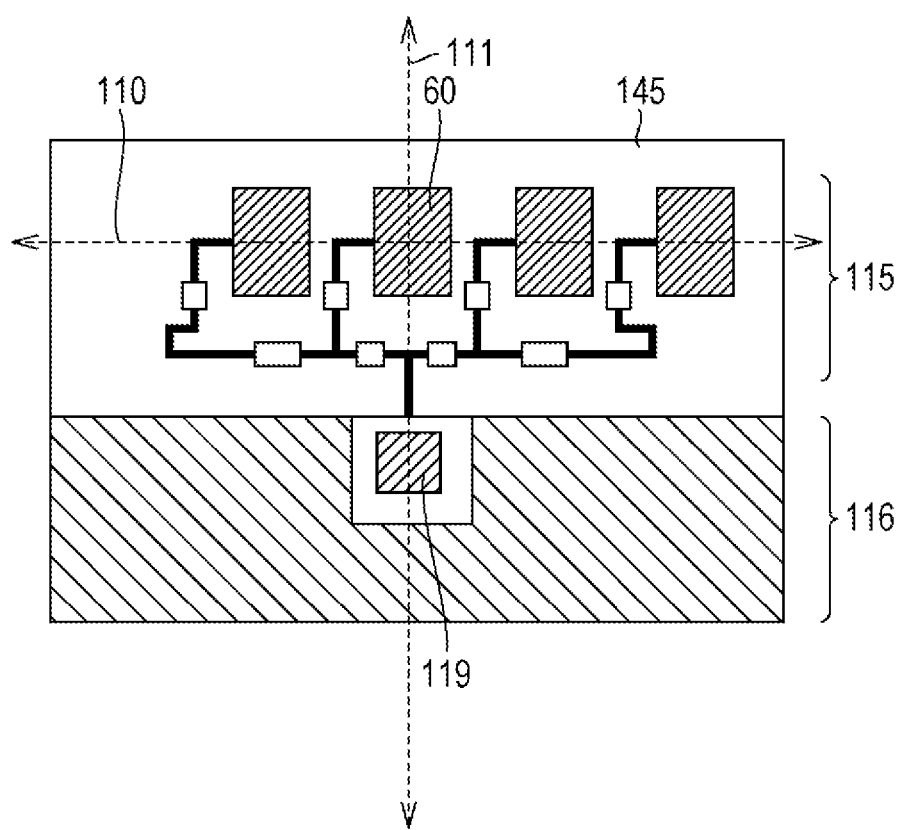

Next, the flat antenna that makes up each of the transmitting antenna portion 25 and receiving antenna portion 30 will be described. FIGS. 4A and 4B are diagrams illustrating the directionality characteristics of a fat antenna according to the first embodiment. FIG. 4A is a diagram illustrating a directional characteristic pattern 110a in the azimuthal (horizontal) direction 110 and directional characteristic pattern 111a in the elevation angle direction 111. The horizontal axis in FIG. 4A indicates the radiation angle representing directionality, and the vertical axis indicates antenna gain (dBi) representing intensity of amplitude.

FIG. 4B is a diagram illustrating the layout and configuration of an antenna evaluation board 145 when the directionality characteristics illustrated in FIG. 4A are obtained. The antenna evaluation board 145 illustrated in FIG. 4B is equivalent to the portion of the antenna portions and high-frequency circuit portion 99 om the board 45a illustrated in FIG. 2. An antenna portion 115 includes four antenna patch element portions 60. A circuit portion 116 is made up of the wiring 70, ground face 55, via holes 49, and so forth, of the high-frequency circuit portion 99 illustrated in FIG. 2. Note that the circuit portion 116 is illustrated schematically in FIG. 4B. The azimuthal direction 110 and elevation angle direction 111 are shown in FIG. 4B.

With reference to FIGS. 4A and 4B, the antenna directionality characteristics represented by the directional characteristic pattern 110a in the azimuthal direction 110 are characteristics exhibiting a directionality peak 113 in the direction of zero degrees azimuthal angle, and symmetrical centered on approximately zero degrees azimuthal angle. On the other hand, the antenna directionality characteristics represented by the directional characteristic pattern 111a in the elevation angle direction 111 are characteristics exhibiting a directionality peak 114 from zero degrees to around +20 degrees, and nonsymmetrical centered on zero degrees elevation angle. The reason for this is that the antenna evaluation board 145 has the antenna portion 115 configured generally symmetrically as to the circuit portion 116 as viewed from the antenna patch element portions 60 in the azimuthal direction 110, but the antenna evaluation board 145 has the antenna portion 115 configured nonsymmetrically as to the circuit portion 116 in the elevation angle direction 111. That is to say, when viewing from the antenna patch element portions 60 in the elevation angle direction 111, one side of the antenna patch element portions 60 is adjacent to the board edge, but the surface of the board continues in the opposite direction from the antenna patch element portions 60, and the circuit portion 116 where metal wiring patterns and grounding face have been formed is adjacent to the antenna patch element portions 60. The directionality characteristics in the elevation angle direction 111 are influenced by the circuit portion 116 side to become nonsymmetrical characteristics centered on zero degrees elevation angle (see directional characteristic pattern 111a).

Accordingly, in a case where the transmitting antenna portion 25 and receiving antenna portion 30 are formed on either side of the high-frequency circuit portion 99 as illustrated in FIG. 2, the radiation patterns of the transmitting antenna portion 25 and receiving antenna portion 30 incline toward parts on the board or metal wiring on the board, over a wide area on the surface of the board (particularly at the high-frequency circuit side ground face). The directionalities of the transmitting antenna portion 25 and receiving antenna portion 30 in the elevation angle direction each make up a radiation pattern inclined toward the high-frequency circuit portion 99 disposed at the middle of the board (referred to as inclined directionality).

This means that when the microwave device 100a having flat antennas is attached to equipment or an installation or the like as a sensing device, the antenna radiation patterns are affected by dielectric portions or metal portions of that equipment. In detail, the direction of the center direction (zero degrees) of the antenna patch element portions 60 is included as a result of the peak position of antenna directionality having been drawn to the dielectric portion or metal portion side. Thus, the effects of inclination of directionality when mounting the microwave device 100a to other equipment can be reduced by correcting through the above-described inclined directionality of the board itself.

Figure 5A:
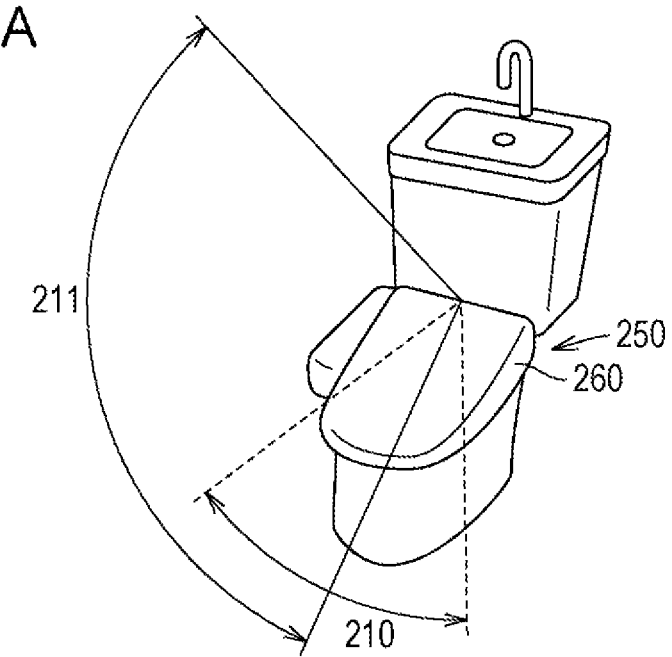
FIGS. 5A and 5B are diagrams illustrating a specific application example of the microwave device according to the first embodiment.
Figure 5B:
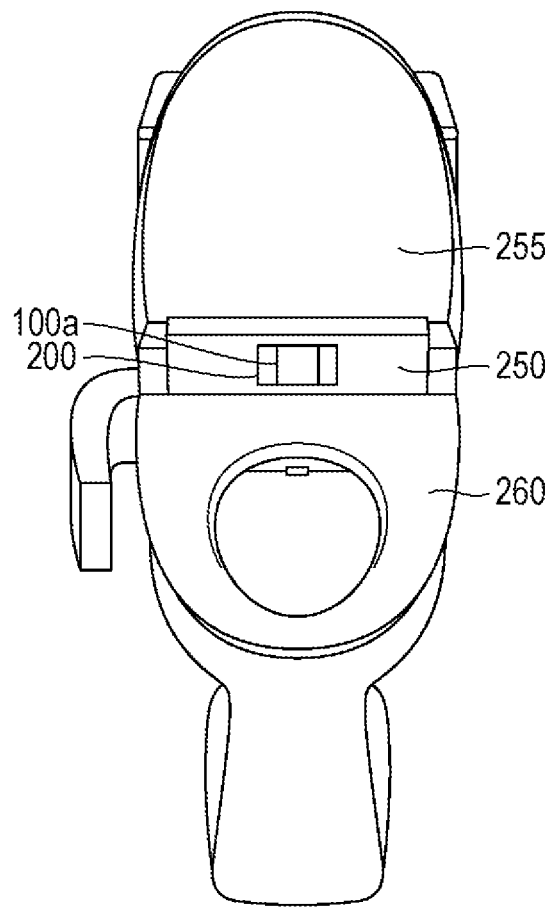

FIGS. 5A and 5B are diagrams illustrating a specific application example of the microwave device 100a according to the first embodiment. An example of mounting the microwave device 100a in a bidet toilet seat 250, as illustrated in FIGS. 5A and 5B, will be described. The microwave device 100a is built into a resin interior of the main unit (toilet seat) of the bidet toilet seat 250 as a radio wave sensor. Accordingly, where the microwave device 100a is built in is not visible to the user.

In a case where a person coms near to the toilet seat of the bidet toilet seat 250, the microwave device 100a (doppler sensor) operates in response to the movement of the person, and a lid 256 automatically opens in this application example. Further, in the present application example, the microwave device 100a can monitor the body movement (movement of the body, pulse, and breathing) of a person sitting on the toilet seat or standing, and close the lid 256 when the person leaves the toilet seat.

In a case of using the microwave device 100a for such an application, the direction is restricted to around an angle of ±20 degrees in the horizontal (azimuthal angle) direction 210, while a somewhat wider directionality angle around ±40 degrees in the vertical (elevation angle) direction 211 is desirable, as illustrated in FIG. 5A. In order to satisfy these characteristics, the board 45a is attached with four antenna patch element portions 60 arrayed in the horizontal direction, the transmitting antenna portion 25 at the top of the board 45a, the high-frequency circuit portion 99 at the middle of the board 45a, and the receiving antenna portion 30 at the bottom of the board 45a. Note that the above arrangement may be rotated by 180 degrees in frontal view. That is to say, the board 45a may be attached with the receiving antenna portion 30 at the top of the board 45a and the transmitting antenna portion 25 at the bottom of the board 45a.

Further, the board 45a may be attached to a control board 200 for power source, communication, or the like. In a case of attaching the microwave device 100a to the bidet toilet seat 250 according to such a layout, the resin portion has a shape three-dimensionally protruding forward as viewed from the microwave device 100*a* at the lid 256 and toilet seat 260, in a state where the toilet seat 260 and lid 256 are closed. Particularly, metal objects such as heaters and wiring are built into the resin portion of the toilet seat 260, and the ceramic portion beneath the toilet seat has a high relative permittivity, such as a permittivity around 9. Accordingly, the directionality of the microwave device 100*a* in the elevation angle direction tends to have characteristics directed toward the lower portion in the vertical direction. That is to say, the characteristics of the directionality in the elevation angle direction of the microwave device 100*a* are such that emitting radio waves in the vertically-upward direction is difficult. In the present embodiment, the directionalities of the transmitting antenna portion 25 and receiving antenna portion 30 in the elevation angle direction are inclined toward the high-frequency circuit portion 99 side of the board 45*a*. Accordingly, when the microwave device 100*a* is attached to the bidet toilet seat 250, inclination of the directionality in the elevation angle direction toward the portion beneath the toilet seat 260 can be suppressed, so the characteristics of the transmitting antenna portion 25 and receiving antenna portion 30 can be made to be antenna directionality characteristics that are not readily affected by structures in the vicinity.

Additionally, the high-frequency circuit portion 99 where parts are mounted is disposed at the middle area of the board 45*a*, and the transmitting antenna portion 25 and receiving antenna portion 30 where no parts are mounted are disposed in areas on either side of the high-frequency circuit portion 99 of the board 45*a*, as flat-form antenna patch element portions 60. According to this layout and configuration, stress generated at the time of cutting individual boards from a multiple board in a step after surface mounting in the manufacturing process, i.e., the effects of stress applied at the perimeter of both end portions of the board, can be avoided. That is to say, the parts mounted to the high-frequency circuit portion 99 at the middle area of the board 45*a* are not readily subjected to unwanted stress and the like when cutting the board, so effects such as parts being dislocated and so forth are very small. Accordingly, the present embodiment is also advantageous in that productivity of the microwave device 100*a* is good.

Regarding Boards having Relative Permittivity of 4 or Greater

In the above-described embodiment, the board 45*a* that is the first board is configured using a board having relative permittivity of 3.3. However, the above-described advantages can be exhibited even when using a board having relative permittivity of 4 or greater as the board 45*a*.

In a case of forming the high-frequency circuit portion 99 on a board having relative permittivity of 2 to 3 as described above, the line width of the lines having characteristic impedance of 50Ω used often with the high-frequency circuit portion 99 greatly changes. Accordingly, reducing the size of the high-frequency circuit portion 99 becomes difficult. Particularly, in a case of configuring power dividers, directional couplers, filters, and so forth, in combination with the main line, there is a problem with a larger line width in that the parasitic component increases at the connection portions of the lines. On the other hand, for boards having a relative permittivity of 4 or greater, an inexpensive board such as FR-4 that is commonly used can be used, as one example. Further, the thickness of the board can be set to be thinner. Accordingly, the line width of lines having characteristic impedance of 50Ω is smaller, so the overall microwave device including the antenna portions and high-frequency circuit portion can be made smaller.

Nonetheless, matching with the air becomes difficult with boards having a high permittivity where the relative permittivity is 4 or greater with regard to the antenna portions in particular, so efficiency of emission into the air is poorer. As a result, magnetic component tends to dwell on the board, so the effects of surface waves increase, and it becomes difficult to secure sufficient isolation characteristics between the transmitting antenna portion and the receiving antenna portion.

In the first embodiment, the high-frequency circuit portion 99, transmitting antenna portion 25, and receiving antenna portion 30 are formed on the first face 69 of the board 45*a*. The transmitting antenna portion 25 and receiving antenna portion 30 are isolated by the high-frequency circuit portion 99 configured of the ground face 55 (first ground face), lines, parts, and so forth. The ground face 66 (second ground face) that is the ground face of the transmitting antenna portion 25 and receiving antenna portion 30, and also is a ground face for grounding the high-frequency circuit portion 99, is formed on the second face 68 that is the rear face of the board 45*a*. The ground face 55 of the board 45*a* and the ground face 66 of the board 45*a* are connected by via holes 54. Thus, a stable high-frequency ground face is formed. The ground face 55 terminates the effects of surface waves and so forth on the board 45*a* and isolation (separation) characteristics of isolating the receiving antenna portion 30 from the transmitting antenna portion 25 improve, so good receiving sensitivity characteristics can be obtained.

As described above, relative permittivity is increased by using a board having relative permittivity of 4 or greater for the microwave device according to the present embodiment. Thus, wavelength on the board is made shorter, and effects of surface waves at the antenna portions are reduced. The size of the microwave device including the high-frequency circuit portion 99 can be further reduced, while securing good high-frequency characteristics.

Using Grounded Coplanar Line

Further, in the present embodiment, the transmitting antenna portion 25 and receiving antenna portion 30 may be configured of microstrip patch antennas with the ground face 66 provided on the second face 68 of the board 45*a*, and the electric power supply lines are configured of microstrip lines (microstrip lines 61 and 61*b*). On the other hand, the transmission line portions of the high-frequency circuit portion 99 are configured of a microstrip line 82 and a grounded coplanar line 81. FIG. 2 illustrates an example of wiring.

The grounded coplanar line 81 is directly connected to the microstrip line 61*b* of the electric power supply line for the antenna portion, so the microstrip line 61*b* and grounded coplanar line 81 are converted. The microstrip lines 61 and 61*b* secure characteristic impedance along with the ground face 66. On the other hand, the grounded coplanar line 81 can secure characteristic impedance by the two parameters of (1) line width of the signal line 81, and (2) distance of a gap between the center of the ground face 55 on the first face 69 of the board 45*a* to the signal line 81, and a signal line with stable characteristic impedance can be configured. Accordingly, impedance of a microstrip line becomes unstable if the ground layer is divided, but a grounded coplanar line becomes a signal line with stable characteristic impedance by appropriately selecting the width of the signal line 81 and the gap as to the ground face 55 present on both sides, which will be described below.

The advantages of conversion from the microstrip line 61*b* to the ground coplanar line 81 in the high-frequency circuit portion 99 will be described. Part of the ground face 66 is removed at the rear face from the circuit as illustrated in FIG. 3, and two through hole lines 71 leading from the first face 69 of the board 45a to the second face 68 are connected by the wiring portion 72 on the second face 68. Accordingly, part of the ground face 66 is divided, but conversion of the divided portion to the ground coplanar line 81 at the first face can reduce the effects of characteristic impedance of the microstrip line 61b from becoming unstable. That is to say, the characteristic impedance of the high-frequency line can be maintained stable between the microstrip line 61b and the ground coplanar line 81, and a high-frequency circuit portion 99 that operates in a stable manner can be configured.

Second Embodiment

A second embodiment of the present disclosure will be described below. Note that points of difference as to the first embodiment will be described below, and that description of parts that are the same as or equivalent to the first embodiment will not be repeated.

Figure 6:
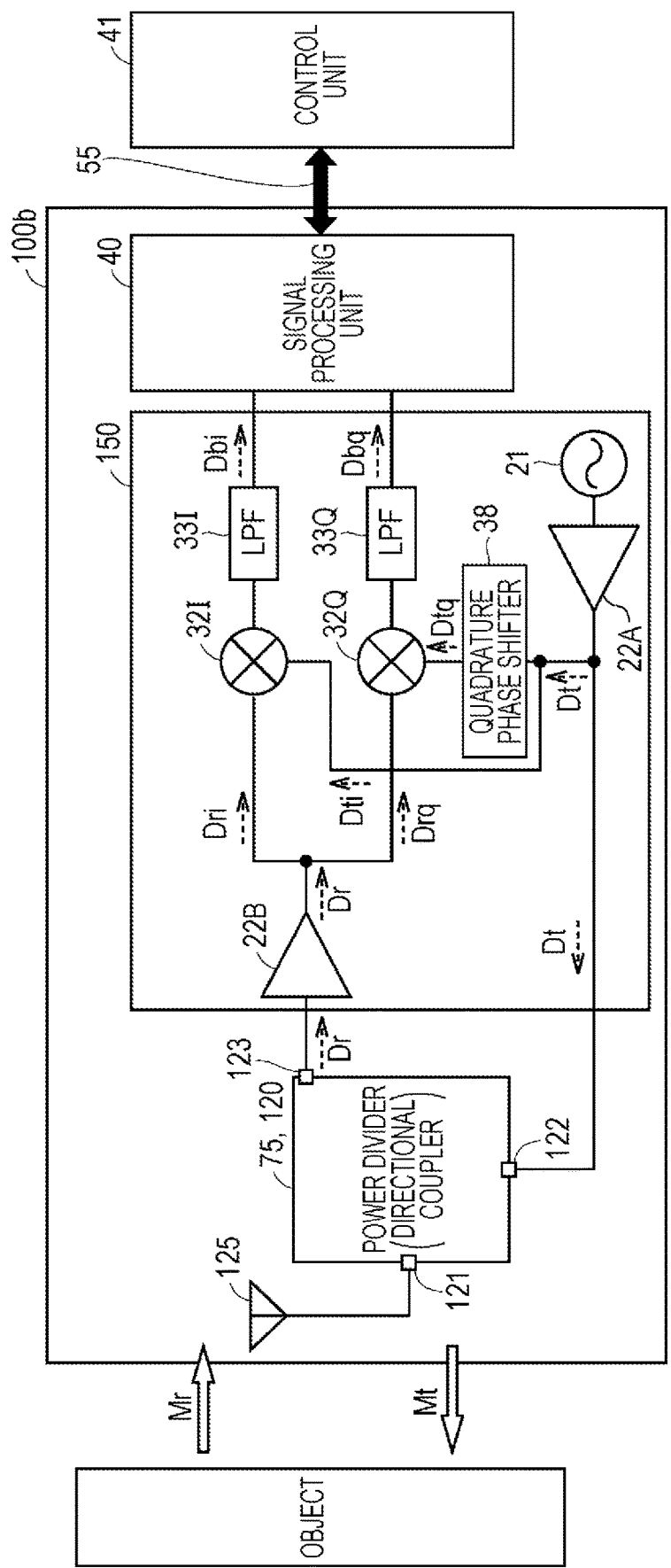
FIG. 6 is a block diagram illustrating the configuration of a microwave device according to a second embodiment.

FIG. 6 is a block diagram illustrating the configuration of a microwave device 100b according to the second embodiment. Unlike the first embodiment (see FIG. 1), the transmitting antenna portion 25 and receiving antenna portion 30 illustrated in FIG. 1 are shared in the second embodiment, thereby configuring a transmitting/receiving antenna portion 125 (shared antenna portion). A power supply terminal 121 of the transmitting/receiving antenna portion 125 and a transmitting side terminal 122 and receiving side terminal 123 of a high-frequency circuit portion 199 are connected by a Wilkinson power divider 75 that has isolation characteristics between the transmitting side terminal 122 and receiving side terminal 123, or a branch line divider 120 having directionality. Connecting the transmitting side terminal 122 and receiving side terminal 123 by the Wilkinson power divider 75 that has isolation characteristics therebetween, or the branch line divider 120 having directionality, isolates transmission signals Dt and reception signals Dr.

Now, the above-described Wilkinson power divider 75 and branch line divider 120 can each operate as a Wilkinson power coupler 75 and a branch line coupler as well. These elements function as power couplers when transmitting, and transmission signals Dt from the transmitting side terminal 122 are supplied to the transmitting/receiving antenna portion 125 via the power supply terminal 121 (output terminal), and microwaves Mt are output. At this time, leakage component of transmission signals Dt to the receiving side terminal 123 side is reduced due to isolation characteristics between the transmitting side terminal 122 and receiving side terminal 123, so distortion in the low-noise amplifier (amplifier 22B) can be removed. On the other hand, upon the reflected waves Mr of microwaves received at the transmitting/receiving antenna portion 125 being input to the power supply terminal 121, the Wilkinson power divider 75 (or branch line divider) operates as a power divider to output reception signals to the receiving side terminal 123 and transmitting side terminal 122. Signals Dr from the receiving side terminal 123 are input to the low-noise amplifier (amplifier 22B) and amplified. On the other hand, transmission signals Dr output to the transmitting side terminal 122 are terminated at the transmitting side amplifier (amplifier 22A). Note that in the following, description will be made regarding a Wilkinson power divider 75 and branch line divider 120.

Configuration of Flat Antenna Integrated Circuit

Figure 7A:
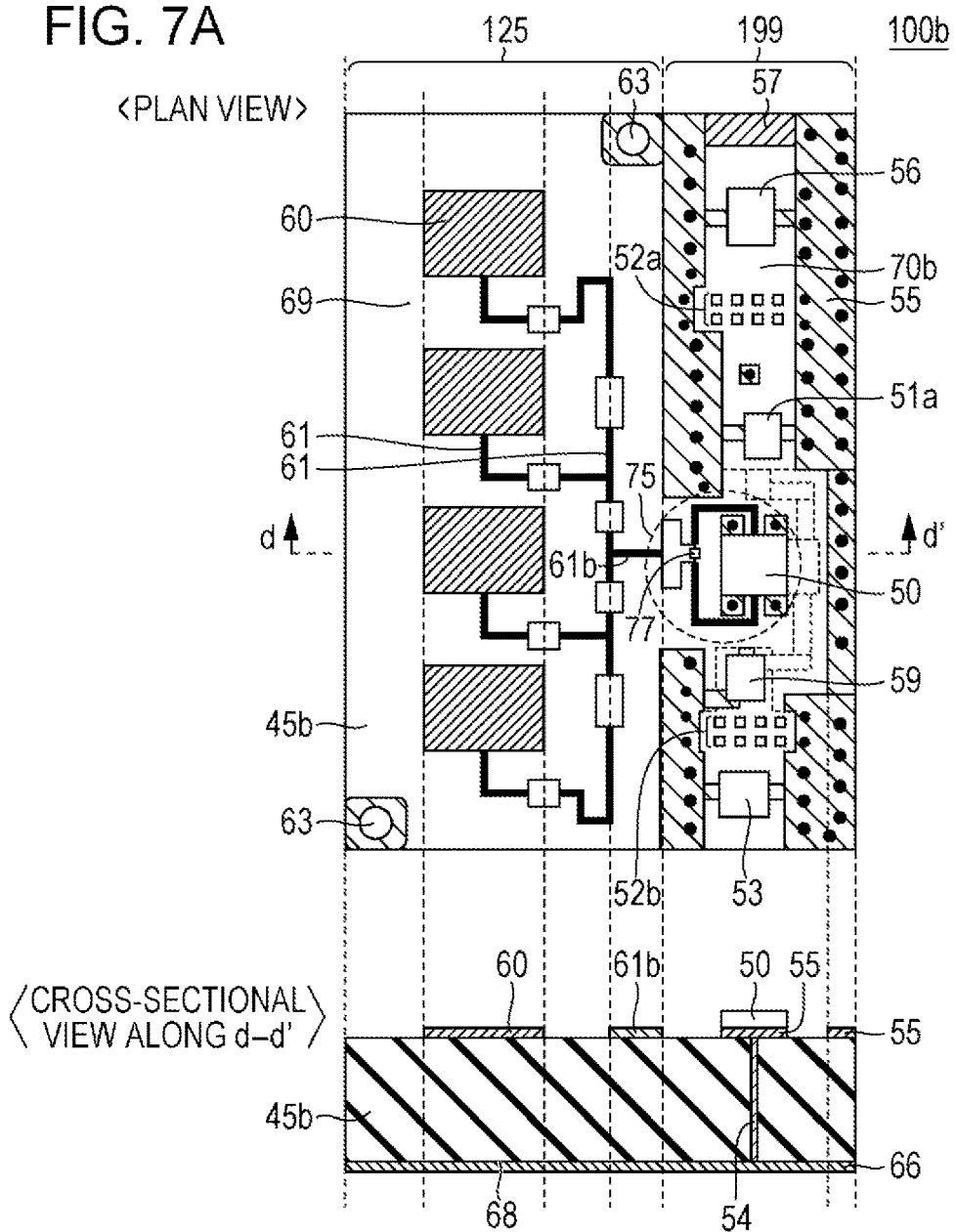
FIGS. 7A through 7C are diagrams illustrating the first face and a cross-sectional configuration of a board of the microwave device according to the second embodiment.
Figure 7B:
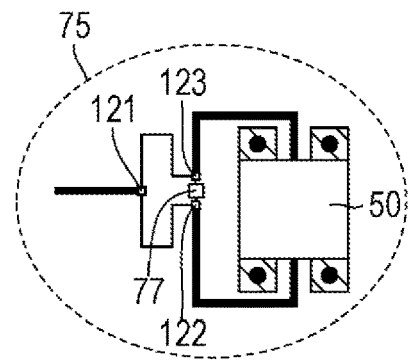
Figure 7C:
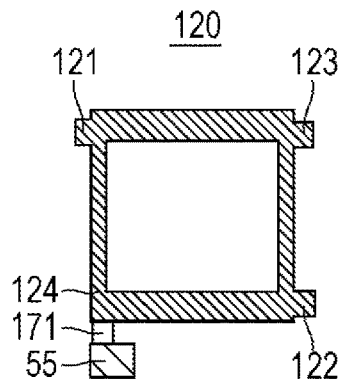

FIGS. 7A through 7C are diagrams illustrating a first face and cross-sectional view of a board of the microwave device according to the second embodiment. In the present embodiment, the transmitting/receiving antenna portion 125, Wilkinson power divider 75, and high-frequency circuit portion 199 are configured on the first face 69 of a board 45b. The high-frequency circuit portion 199 is made up of the RFIC 50, power source IC 53, oscillator control part 59 and LCR (indictor, capacitor, resistor) parts 52b for the RFIC, op-amp/comparator 51a and microprocessor 56 for analog signal processing (including A/D conversion part), and LCR parts 52a related thereto. The components are wired by wiring 70b. In the second embodiment, the board 45b is equivalent to the "first board".

As illustrated in detail in FIG. 7B, the power supply terminal 121 at the transmitting/receiving antenna portion 125 side of the Wilkinson power divider 75 is divided into the transmitting side terminal 122 and receiving side terminal 123. An absorption resistor 77 is connected for matching of the three terminals (power supply terminal 121, transmitting side terminal 122, and receiving side terminal 123) and isolation of the transmitting side terminal 122 and receiving side terminal 123.

Normally, 50Ω is used for the characteristic impedance of the transmitting/receiving antenna portion 125 and RFIC 50 (high-frequency circuit portion), so 100Ω is suitable for the resistance value of the absorption resistor 77. However, securing an ideal 50Ω system is difficult, so a resistance value that has been appropriately adjusted may be used. Transmission signals Dt are supplied from the RFIC 150 to the transmitting/receiving antenna portion 125 via the Wilkinson power divider 75, and microwaves Mr are emitted. On the other hand, arriving microwaves Mt are received at the transmitting/receiving antenna portion 125 and reception signals are input to the Wilkinson power divider 75. The reception signals are divided into two at the Wilkinson power divider 75, and the divided reception signals Dr are input to the RFIC 50.

Note that the branch line divider 120 illustrated in FIG. 7C may be used instead of the three-terminal Wilkinson power divider 75. In this case, a 50Ω terminal resistor 171 is connected to a terminal 124, and the terminal 124 is connected the ground face 55 via the terminal resistor 171 and grounded.

As illustrated in the cross-sectional view taken along line d-d' in FIG. 7A, the ground face 66 shared by the transmitting/receiving antenna portion 125 and high-frequency circuit portion 199 is configured on the second face 68 of the board 45b. The ground face 55 (first ground face) and ground face 66 (second ground face) of the high-frequency circuit portion 199, are connected by via holes 54, configuring a shared ground face for the shared antenna portion and high-frequency circuit portion. Operations of the microwave device 100b after reception signals Dt are input to the RFIC are the same as with the microwave device 100a according to the first embodiment, so description thereafter will not be repeated.

In the configuration of the second embodiment, the ground face 55 and the high-frequency circuit portion 199 configured of lines and high-frequency parts and so forth are disposed in an area on the first face 69 of the board 45b that is on the opposite side from the area to where the transmitting/receiving antenna portion 125 is formed. As a result, the directionality of the transmitting/receiving antenna portion 125 traversing the high-frequency circuit portion 199 is affected by the ground face, wiring, parts, and so forth, of the high-frequency circuit portion 199, and becomes a directionality further inclined toward the high-frequency circuit portion 199 side (referred to as "inclined directionality"). Such characteristics themselves are the same as the characteristics of the microwave device 100a according to the first embodiment.

The second embodiment differs from the first embodiment with regard to the point of how the microwave device 100b is attached. That is to say, when attaching the microwave device 100b having the flat antenna (transmitting/receiving antenna portion 125) to equipment or an installation or the like as a sensing device, the orientation of attaching the microwave device 100b is set such that the high-frequency circuit portion 199 side is disposed on the outer side closer to the air. The above-described inclined directionality of the microwave device 100b enables correction and reduction of effects on the antenna radiation pattern from dielectric portions or metal portions of the equipment. Further, the transmitting antenna and receiving antenna are shared in the second embodiment, so the microwave device can be configured smaller and less expensive.

Application Example

FIGS. 8A and 8B are diagrams illustrating a specific application example of the microwave device 100b according to the second embodiment. An example of mounting the microwave device 100b in a bidet toilet seat 250, as illustrated in FIGS. 8A and 8B, will be described. The microwave device 100b is built into a reason interior of the main unit (toilet seat) of the bidet toilet seat 250 as a radio wave sensor. Accordingly, where the microwave device 100b is built in is not visible to the user. In a case where a person comes near to the toilet seat of the bidet toilet seat 250, the microwave device 100b (doppler sensor) operates in response to the movement of the person, and a lid 256 automatically opens. The microwave device 100b can monitor the body movement (movement of the body, pulse, and breathing) of a person sitting on the toilet seat or standing, and close the lid 256 when the person leaves the toilet seat.

In a case of using the microwave device 100b for such an application, the direction is restricted to around an angle of ±20 degrees in the horizontal (azimuthal angle direction) 210, while a somewhat wider directionality angle around ±40 degrees in the vertical (elevation angle) direction 211 is desirable, as illustrated in FIG. 8A. In order to satisfy these characteristics, the board 45b is attached with four antenna patch element portions 60 arrayed in the horizontal direction, the high-frequency circuit portion 199 at the top of the board 45b, and the transmitting/receiving antenna portion 125 at the bottom of the board 45b.

Further, the board 45b may be attached to a control board 200 for power source, communication, or the like. In a case of attaching the microwave device 100b to the bidet toilet seat 250 according to such a layout, the resin portion has a shape three-dimensionally protruding forward as viewed from the microwave device 100b at the lid 256 and toilet seat 260, in a state where the toilet seat 260 and lid 256 are closed. Particularly, metal objects such as heaters and wiring are built into the resin portion of the toilet seat 260, and the ceramic portion beneath the toilet seat has a high relative permittivity, such as a permittivity around 9. Accordingly, the directionality of the microwave device 100b in the elevation angle direction tends to have characteristics directed toward the lower portion in the vertical direction. That is to say, the characteristics of the directionality in the elevation angle direction of the microwave device 100b are such that emitting radio waves in the vertically-upward direction is difficult. In the present embodiment, the directionality of the transmitting/receiving antenna portion 125 in the elevation angle direction is inclined toward the high-frequency circuit portion 199 side of the board 45b. Accordingly, which the microwave device 100b is attached to the bidet toilet seat 250, inclination of the directionality in the elevation angle direction toward the portion beneath the toilet seat 260 can be suppressed, so the characteristics of the transmitting/receiving antenna portion 125 can be made to be antenna directionality characteristics that are not readily affected by structures in the vicinity.

Third Embodiment

A third embodiment of the present disclosure will be described below. Note that points of difference as to the first embodiment or second embodiment will be described below, and that description of parts that are the same as or equivalent to the first embodiment will not be repeated.

Figure 9:
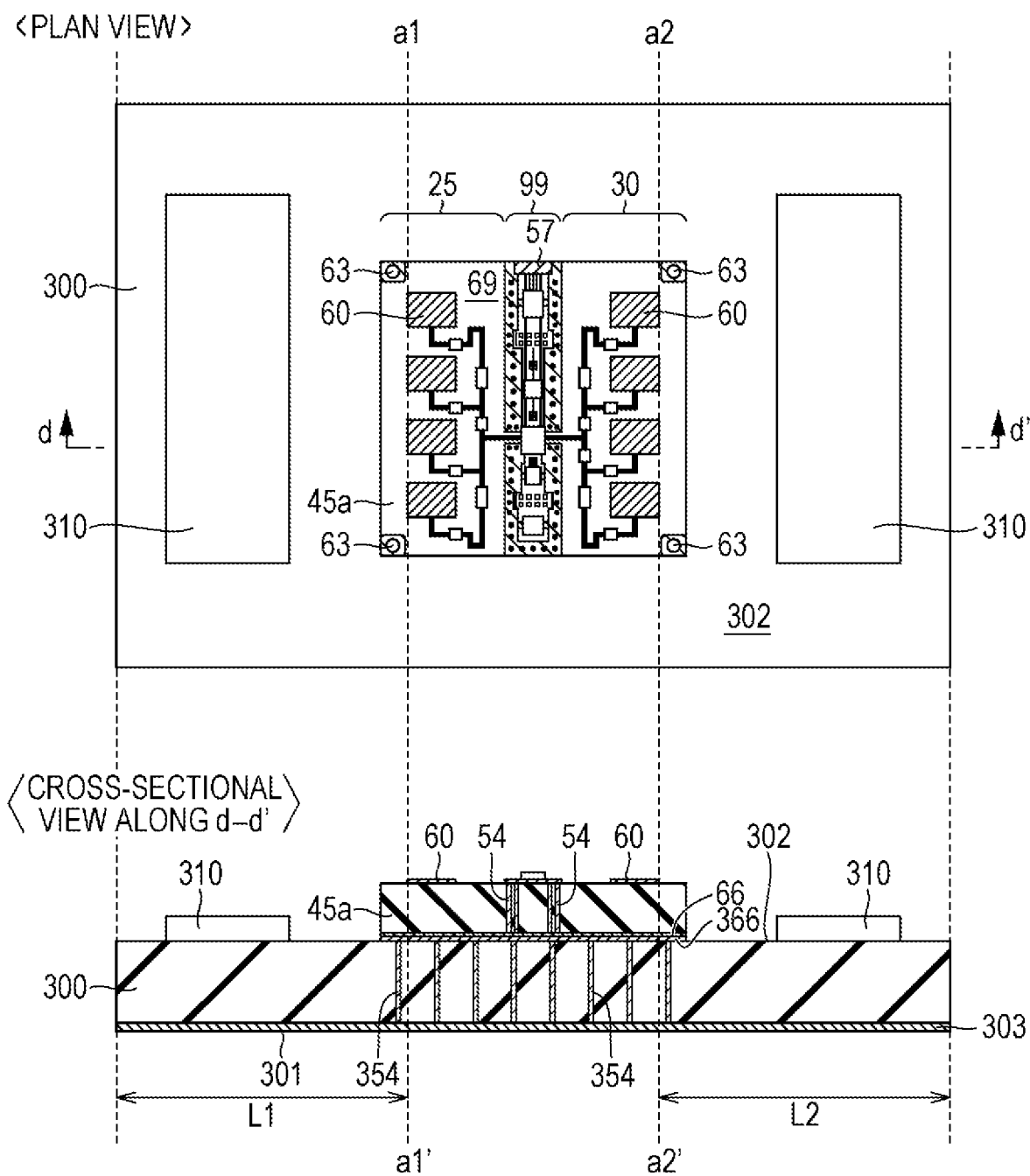
FIG. 9 is a block diagram illustrating the configuration of a microwave device according to a third embodiment.

FIG. 9 is a diagram illustrating the configuration of a microwave device according to the third embodiment. In the third embodiment, the ground face 66 (second ground face) of the board 45a (first board) is electrically connected to a ground face 366 of a first face 302 of a board 300 (second board). The ground face 366 (defined as "third ground face") of the board 300 is connected to a metal layer of a second face 301 of the board 300 by multiple second via holes 354. A ground face 303 (defined as "fourth ground face") is formed as a metal layer of the second face 301 of the board 300. Accordingly, the fourth ground face (ground face 303) makes up a shared ground face for the transmitting antenna portion 25, receiving antenna portion 30, and high-frequency circuit portion 99.

The area of the board 300 is sufficiently larger than the area of the board 45a. For example, distances L1 and L2 from the edges (indicated by line a1-a1' and line a2-a2' in FIG. 9) of the antenna patch element portions 60 on the board 45a to the edges of the third board that are twice or longer than the operating wavelength (e.g., at 24.1 GHz, λ=12.4 mm) are secured. Accordingly, characteristics closer to those of an infinite ground board can be obtained, so leakage to the board 300 (backward radiation) can be reduced at the board 45a. Also, the effects of disturbance in radiation pattern due to the surrounding housing and the installation to which the board 45a has been attached can be reduced.

Further, the ground face has a wide ground area, so the directionality inclined in the elevation angle direction, shown in the first and second embodiments, can be corrected. Accordingly, characteristics where the peak directionality is closer to the frontal direction can be obtained.

As one example, other parts or the like may be mounted to the first face 302 of the board 300. For example, a communication unit or signal control unit of the microwave device 100a may be mounted to the first face 302, or another sensing device 310 or the like may be mounted to the first face 302.

Additionally, although the microwave device 100a is mounted to the board 300 in the example in FIG. 9, but may be electrically connected to another metal object, e.g., an aluminum diecast object or the like. The microwave device 100b may be mounted on the board 300 as well. The microwave device 100a or microwave device 100b may be mounted to the board 300 by the microwave device 100a or microwave device 100b being fixed to the board 300 screwing through screw holes 63 illustrated in FIGS. 2, 3, and 7A.

In the third embodiment, the wiring pattern on the second face 68 of the board 45a (the ends of the two through hole lines 71 and the wiring portion 72) are insulated from the ground layer (ground face 366) of the third board by resist 85 or the like (see FIG. 2). Alternatively, an insulating portion may be configured at a certain portion of the rear-face wiring, where the ground layer is cut out and patterned.

Figure 10:
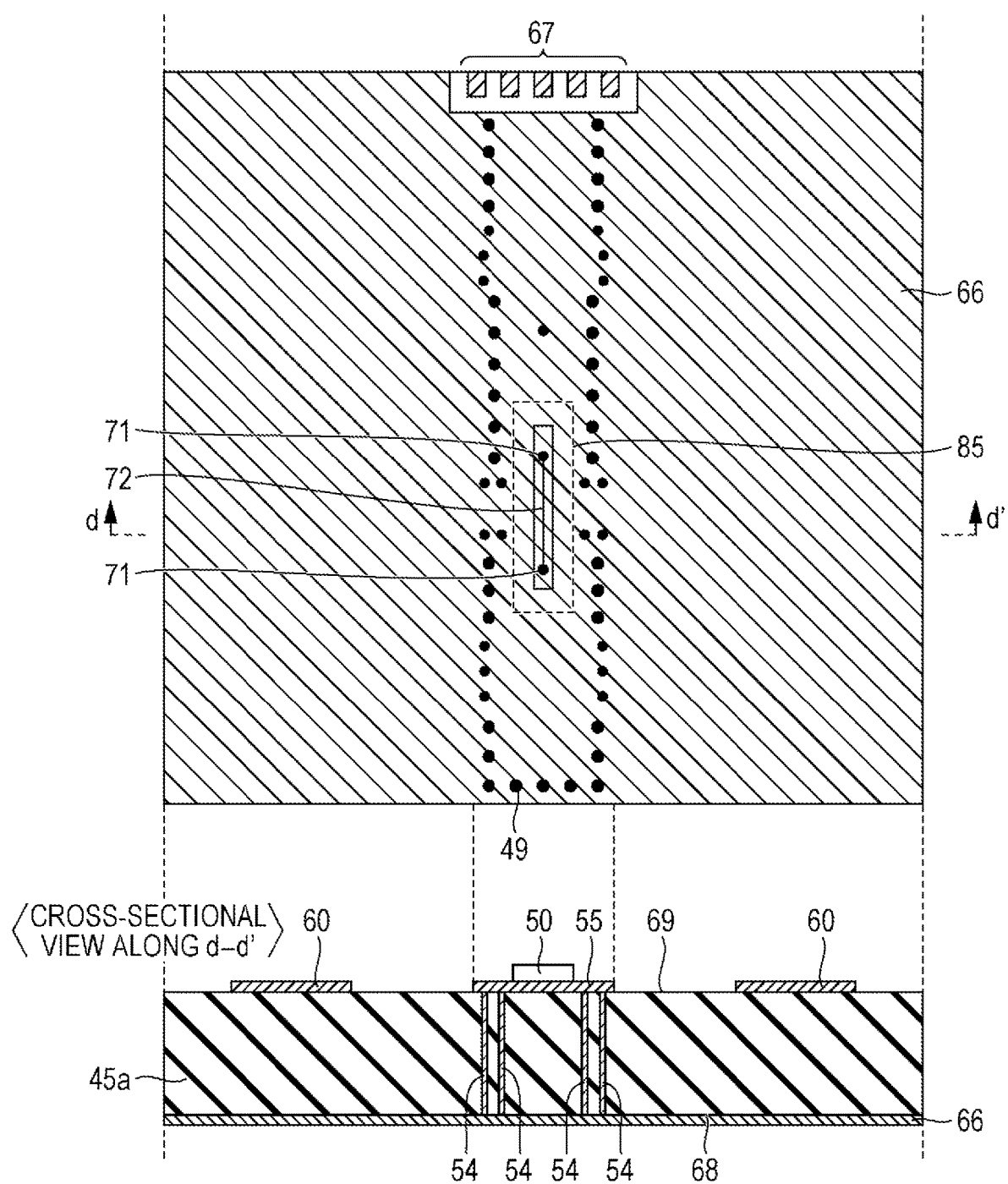
FIG. 10 is a diagram illustrating another form of a rear face and cross-section of a board of the microwave device according to the third embodiment.

FIG. 10 is a diagram illustrating another form of the rear face board that the microwave device according to the third embodiment has, and a cross-sectional view. A portion of the ground layer (ground face 66) where there is wiring and terminals may be cut out, and a wiring pattern 67 provided at that portion, as illustrated in FIG. 10. The board 45a or board 45b may be electrically and physically connected to the ground layer by soldering or the like, to mount the board 45a on the surface.

Fourth Embodiment

A fourth embodiment of the present disclosure will be described below. Note that points of difference as to the first through third embodiments will be described below, and that description of parts that are the same as or equivalent to the first embodiment will not be repeated.

Figure 11:
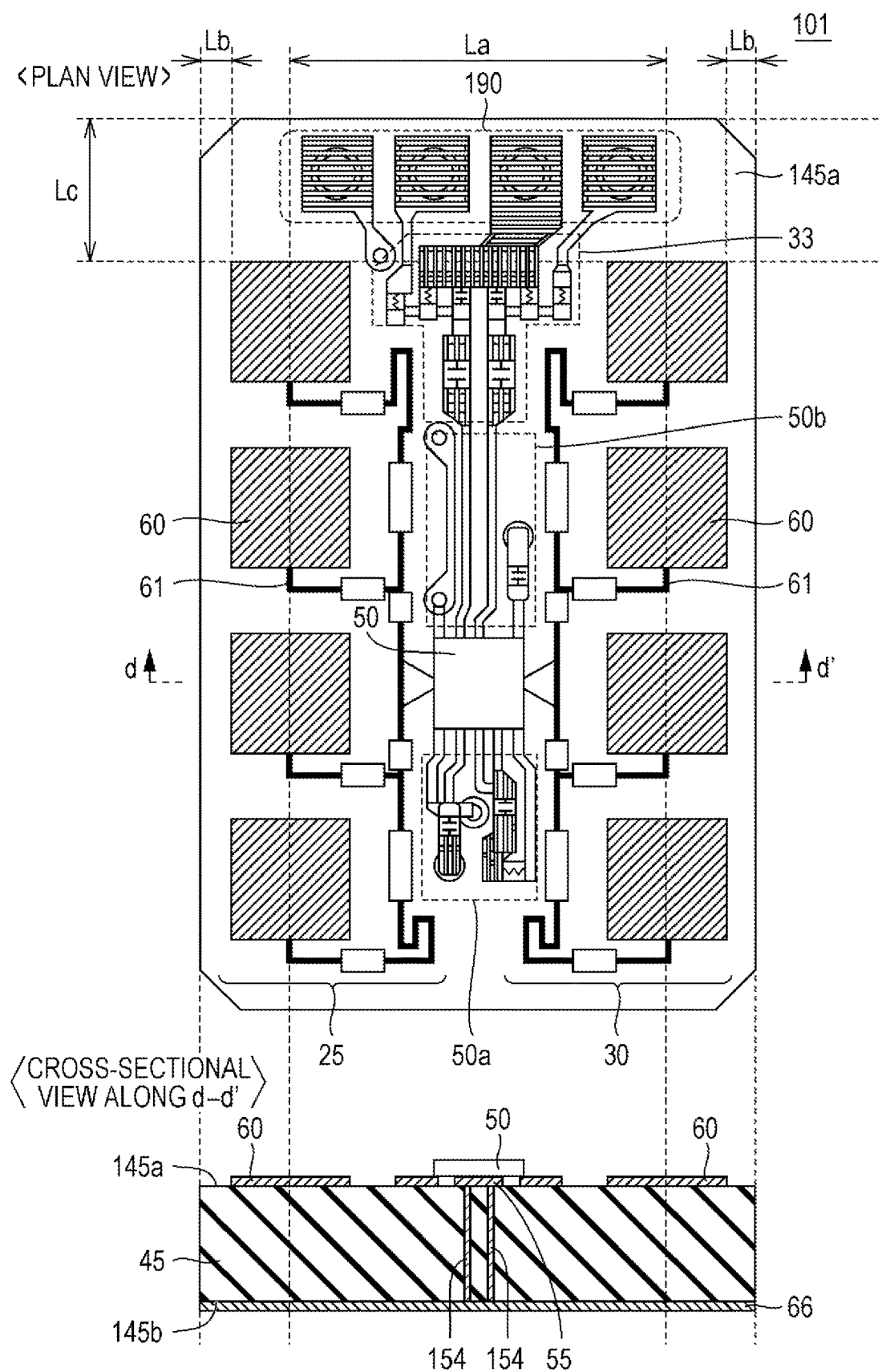
FIG. 11 is a diagram illustrating the configuration of a microwave device according to a fourth embodiment.

FIG. 11 is a diagram illustrating the configuration of the microwave device according to the fourth embodiment. Note that FIG. 11 illustrates a high-frequency block 101 formed on a board 45, within the microwave device according to the fourth embodiment. The transmitting antenna portion 25 and receiving antenna portion 30 are formed on a first face 145a of the board 45 as flat antennas. The transmitting antenna portion 25 and receiving antenna portion 30 are configured as flat antennas on areas to the left and right of the first face 145a, and a high-frequency circuit portion, and peripheral circuit portions 50a and 50b thereof, and a filter circuit 33, are formed on the middle area of the first face 145a.

The input/output lines (microstrip lines 61) of the transmitting antenna portion 25 and receiving antenna portion 30 are connected to the RFIC 50, which is a part included in the high-frequency circuit portion.

The high-frequency circuit portion is made up of the RFIC 50, power source unit, peripheral circuit portions 50a and 50b of the RFIC 50, the filter circuit 33 for I and Q channels, and a pin header portion 190 that is an input/output portion.

In a case where the first face 145a is not suitable for laying out wiring of the peripheral circuit portions 50a and 50b due to input/output lines of the RFIC 50 and so forth, this wiring may be laid out on the rear face of the board 45. Part of the plane metal portion of a second face 145b of the board 45 is cut away. Through multiple through holes from the first face 145a, wiring connecting these through holes may be laid out at portions where the plate metal portion has been removed. This enables wiring of signals lines (omitted from illustration). The grounding conductor of the first face 145a is electrically connected to the grounding conductor of the second face 145b by multiple via holes 154 in the present embodiment.

FIG. 11 includes a cross-sectional view taken along line d-d' in the plan view, in addition to the plan view. The ground face 55 of the first face 145a of the board 45 and the ground face 66 of the second face are electrically connected via the multiple via holes 154, as illustrated in the cross-sectional view. The high-frequency impedance between the ground face 55 and ground face 66 is approximately 0Ω. The ground face 55 and ground face 66 form a high-frequency ground face shared by the high-frequency circuit block 101, transmitting antenna portion 25, and receiving antenna portion 30.

The antenna and high-frequency circuit portion are configured using both faces of a single board 45, in the same way as in the first embodiment. The transmitting antenna portion 25, and receiving antenna portion 30, RFIC 50, peripheral circuit portions 50a and 50b, and filter circuit 33 are formed on the same face (first face 145a) of the board 45. Accordingly, connection thereof by through holes, as in conventional configurations, is unnecessary. The input/output impedance of the signal line portion (microstrip line 61) of the antenna power supply portion as to the transmitting/receiving portion of the high-frequency circuit portion 50 can be stably maintained to around 50Ω generally used with high frequency±20Ω, as one example. Accordingly, impedance matching at the connection between the transmitting antenna portion 25, receiving antenna portion 30, and RFIC 50 is readily secured. Accordingly, high-frequency loss is reduced, so uniform and stable signals are supplied from the high-frequency circuit portion to the transmitting antenna portion 25 and receiving antenna portion 30, so the radiation efficiency of the antenna can be maintained at high efficiency, and effects of unwanted radiation and so forth from the electric power supply portion can be reduced.

Patterns of the transmitting antenna portion 25 and receiving antenna portion 30 are formed on the first face 145a of the board 45. The ground face 55 shared by the RFIC 50 and the peripheral circuit portions 50a and 50b is formed on the first face 145a. The ground face 66 for the transmitting antenna portion 25 and receiving antenna portion 30, and for the high-frequency circuit block 101, is formed on the second face 145b of the board 45. The ground face 55 and ground face 66 are connected by via holes 154, so a shared ground face can be formed for the transmitting antenna portion 25 and receiving antenna portion 30, RFIC 50, and peripheral circuit portions 50a and 50b. Accordingly, a stable high-frequency ground face can be formed, so all of the transmitting antenna portion 25 and receiving antenna portion 30, RFIC 50, and peripheral circuit portions 50a and 50b, can maintain high-performance and stable operations.

La in FIG. 11 represents the distance between the transmitting antenna portion 25 and the receiving antenna portion 30. The greater the distance La is, the greater the wiring loss of the power supply lines (microstrip line 61b) is. Also, if the transmitting antenna portion 25 and receiving antenna portion 30 are too far apart, matching the beam axes of the transmitting antenna portion 25 and receiving antenna portion 30 becomes difficult, so antenna performance deteriorates.

On the other hand, in a case where the transmitting antenna portion 25 and receiving antenna portion 30 are brought too close together to reduce the size of the high-frequency circuit block 101, the antennas will affect each other at the time of transmitting and receiving radio waves, and the antenna radiation patter will break down. Further, the peak axis of the antenna radiation beam will deviate away from the normal direction of the flat antenna. Accordingly, in a case where the transmitting antenna and receiving antenna are integrally formed on the board, there will be a mismatch in the peak direction of radiation beams between the transmitting antenna and receiving antenna, and deviation away from the target to be sensed will occur. This will lead to marked deterioration in sensitivity.

Dependence of Antenna Characteristics on Spacing Between Power Supply Lines (La Length)

In the fourth embodiment, the distance La between the transmitting antenna portion 25 and the receiving antenna portion 30 is 0.7λ to 2λ. Thus, the above-described effects can be reduced.

FIGS. 12A through 13B are diagrams illustrating radiation patterns of antenna characteristics according to the fourth embodiment. The radiation patterns represent the directionality in the azimuthal direction 175 and the elevation angle direction 176. The azimuthal direction 175 corresponds to the direction of arrays of the four elements of the patch antenna. The elevation angle direction 176 is a direction orthogonal to the azimuthal direction 175.

FIGS. 12A through 13B also illustrate the positional relation between the transmitting antenna portion 25 and receiving antenna portion 30 on the board. Curves 175a and 175b indicate the directionality of the azimuthal direction 175 and the elevation angle direction 176, respectively. The beam width representing the directionality of the azimuthal direction 175 is narrower in comparison with the beam width representing the directionality of the elevation angle direction 176.

Figure 12A:
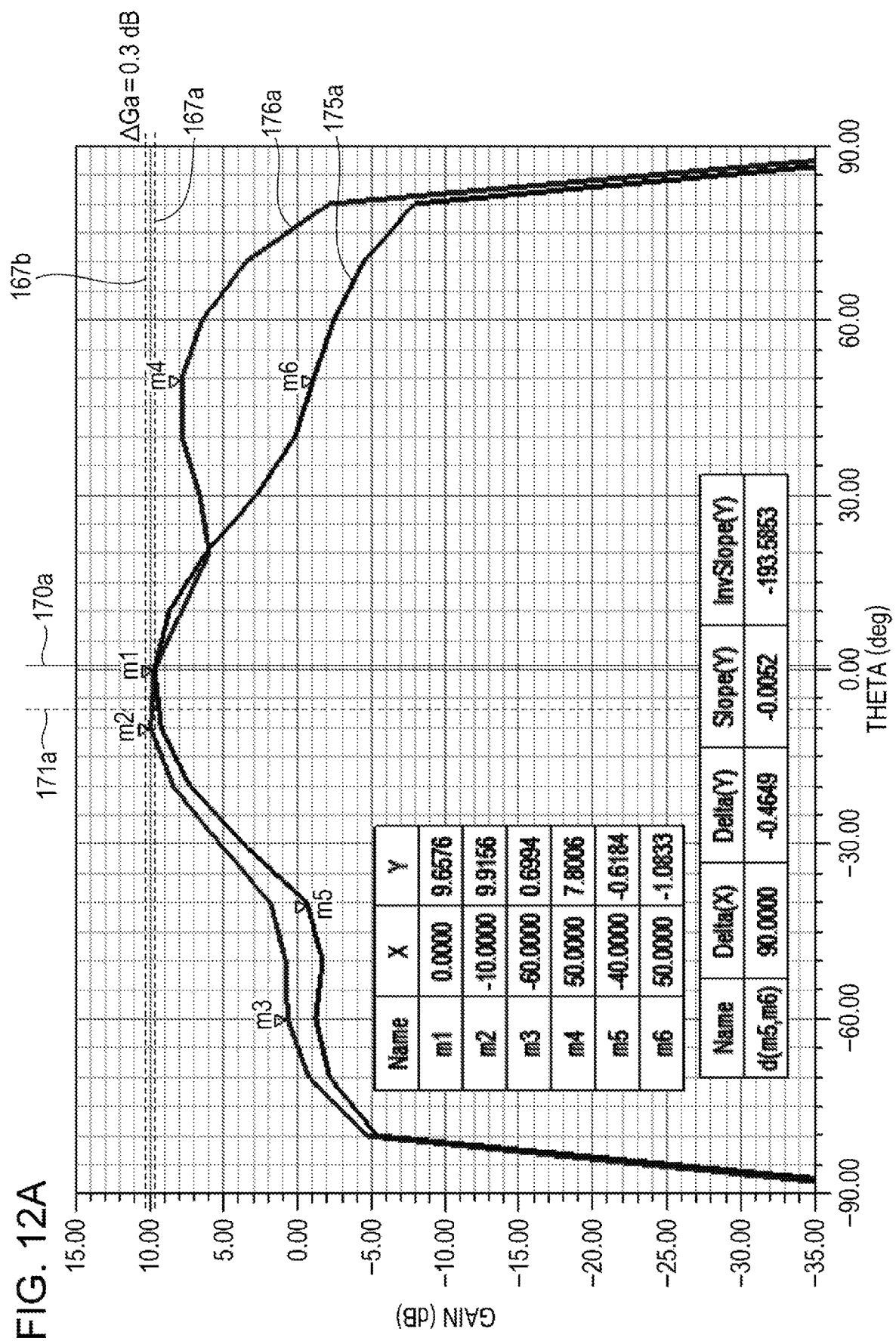
FIGS. 12A and 12B are diagrams illustrating a radiation pattern of antenna characteristics in a case where La=9.65 mm (0.78λ)
Figure 12B:
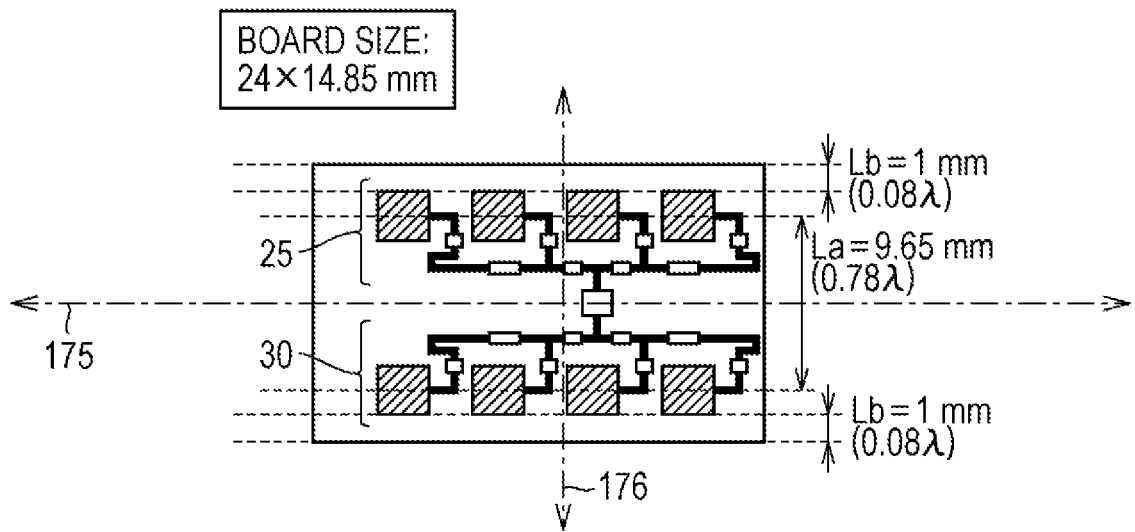
Figure 13A:
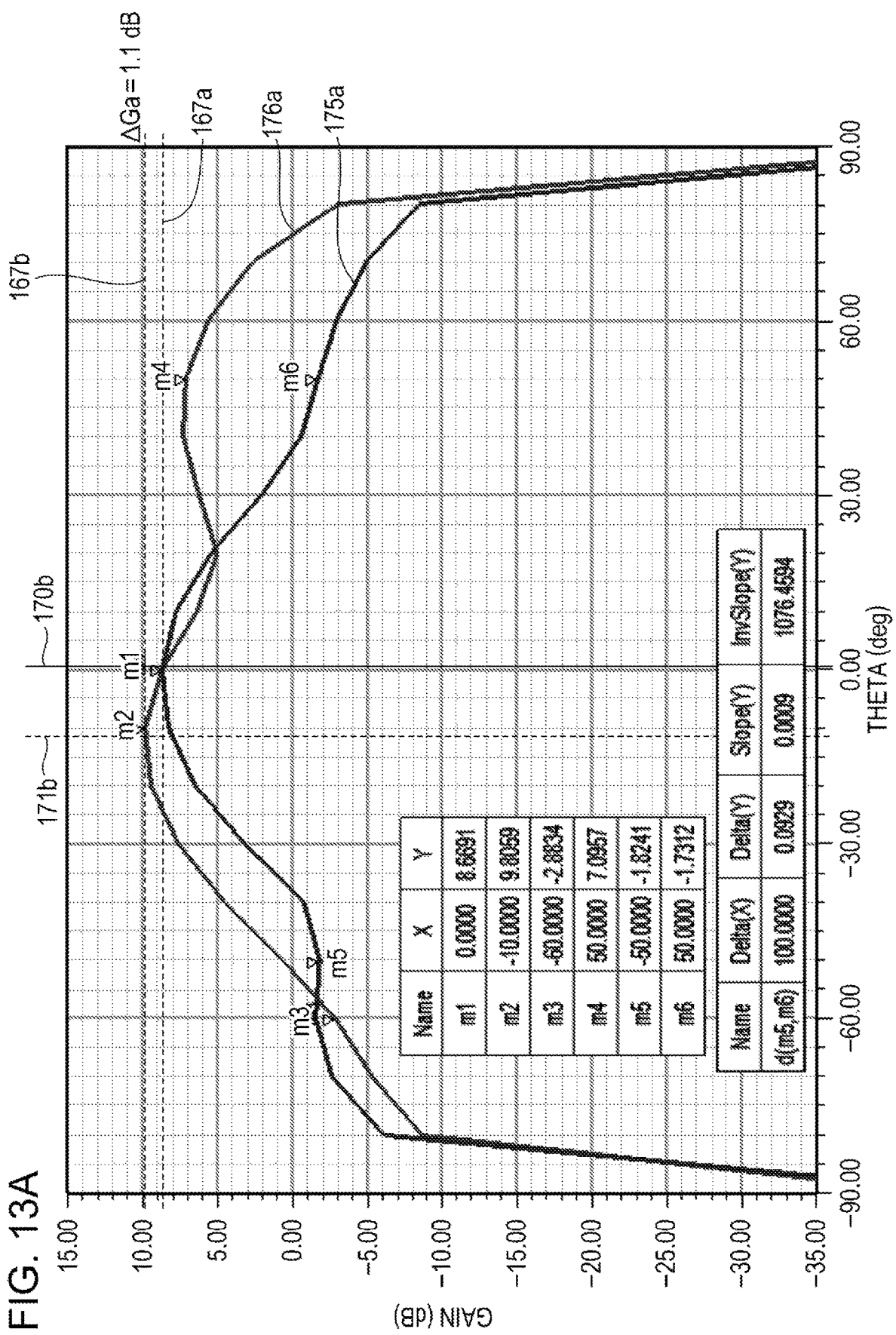
FIGS. 13A and 13B are diagrams illustrating a radiation pattern of antenna characteristics in a case where La=8.75 mm (0.71λ)
Figure 13B:
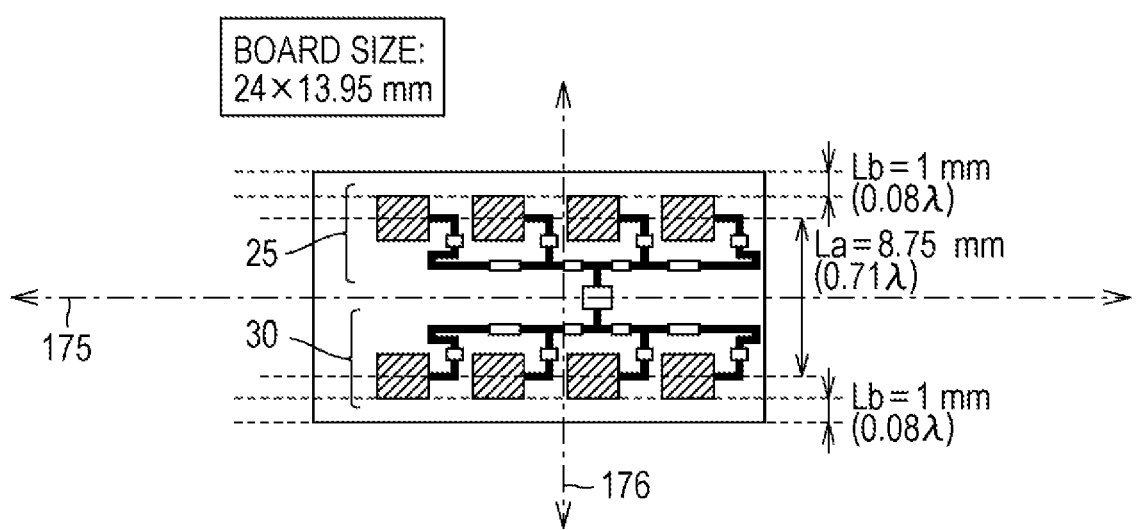

As one example, in a case where the frequency is 24.1 GHz, the wavelength λ in the air is 12.4 mm, and 0.7λ to 2λ is 8.68 mm to 24.8 mm. FIG. 12A is a diagram illustrating a radiation pattern of antenna characteristics in a case where La=9.65 mm (0.78λ), indicating a radiation pattern where the distance La is within the above range. FIG. 13A is a diagram illustrating a radiation pattern of antenna characteristics in a case where La=8.75 mm (0.71λ), indicating a radiation pattern of antenna characteristics where the distance La is near the boundary portion (0.7λ) of the above range. Note that in this example, the distance Lb between the antenna patch element portions 60 and the board edge where the ground face 66 exists is 1 mm.

In FIGS. 12A and 13A, the frontal direction in the directionality of elevation angle direction 176 of the transmitting antenna portion 25 and receiving antenna portion 30 is represented by lines denoted by symbols 170a and 170b. The peak directions of directionality are indicated by lines denoted by symbols 171a and 171b. In the directionality illustrated in FIG. 12A, the gain difference (ΔGa) between the frontal direction gain (indicated by line denoted by symbol 167a) and gain in the peak direction (indicated by line denoted by symbol 167b) is 0.3 dB. In the directionality illustrated in FIG. 13A, the gain difference between the frontal direction and peak direction is 1.1 dB, which is even greater.

The transmitting antenna portion 25 and receiving antenna portion 30 are integrally formed on the board 45. Accordingly, it is desirable, regarding the antenna characteristics of the transmitting/receiving as a whole of the transmitting antenna portion 25 and receiving antenna portion 30, that the peak direction of radiation beam matches the fontal direction. The difference in gain between the frontal direction and peak direction is at least twice in transmitting/receiving. Accordingly, in a case of transmitting/receiving as a whole, the difference in gain between the frontal direction and peak direction is 0.6 dB in the example in FIG. 12A, and is 2.2 dB in the example in FIG. 13. In the example illustrated in FIG. 13A, the gain in the frontal direction of the flat antenna is smaller by 2 dB or more as to the peak direction. That is to say, sensitivity in the frontal direction deteriorates.

Dependence of Antenna Characteristics on Edge Length (Lb Length)

Figure 14:
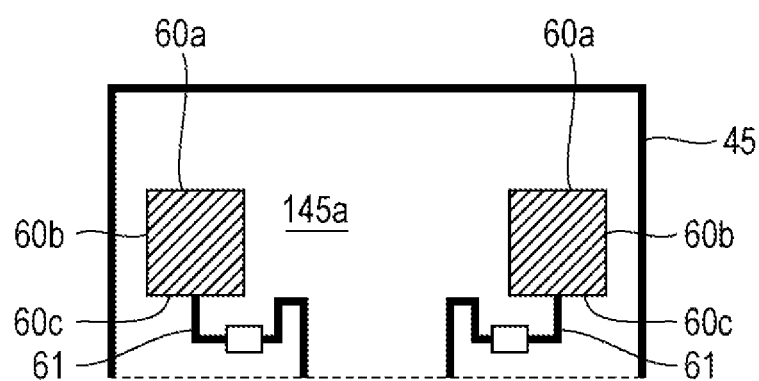
FIG. 14 is a diagram illustrating a patch element portion situated near an edge of the board.

Peak axis deviation of the antenna radiation beam as to the normal direction of the flat antenna is also dependent on the distance Lb between the face side 60b of the antenna patch element portions 60 (see FIG. 11) and the edge of the board where the ground face of the board 45 exists. FIG. 14 is a diagram illustrating patch element portions 60 situated near the edge of the board. In FIG. 14, sides 60b may be sides that are orthogonal to sides 60c of the antenna patch element portions 60 and that are closer to the edge of the board. The sides 60c are sides of the antenna patch element portions 60 that are connected to the electric power supply line (microstrip line 61). The sides 60b may be configured to be distanced by λ/60 or more from the ground portion at the board edge side of the second face 145b of the board 45 where the ground face 66 exists.

The distance Lb has to be reduced in order to reduce the size of the high-frequency circuit block 101. However, a smaller distance Lb has the following problems, in that
1) radiation from the rear face of the board increases,
2) frontal-direction gain of the radiation beam deteriorates, and
3) in elevation-angle directionality the peak direction of the radiation beam also deviates from the frontal direction that is the normal direction of the face of the board.

Specifically, in a case of frequency 24.1 GHz, the wavelength λ in air is 12.4 mm, and λ/60 is 0.20 mm. As for an example of a square patch antenna on the board 45, the length of one side of an antenna patch element portion 60 is around 3.2 mm. According to the configuration of the present embodiment, increase in size of the board can be avoided within the range of the distance Lb described above. Accordingly, the high-frequency circuit can be small and yet have high performance.

Figure 15A:
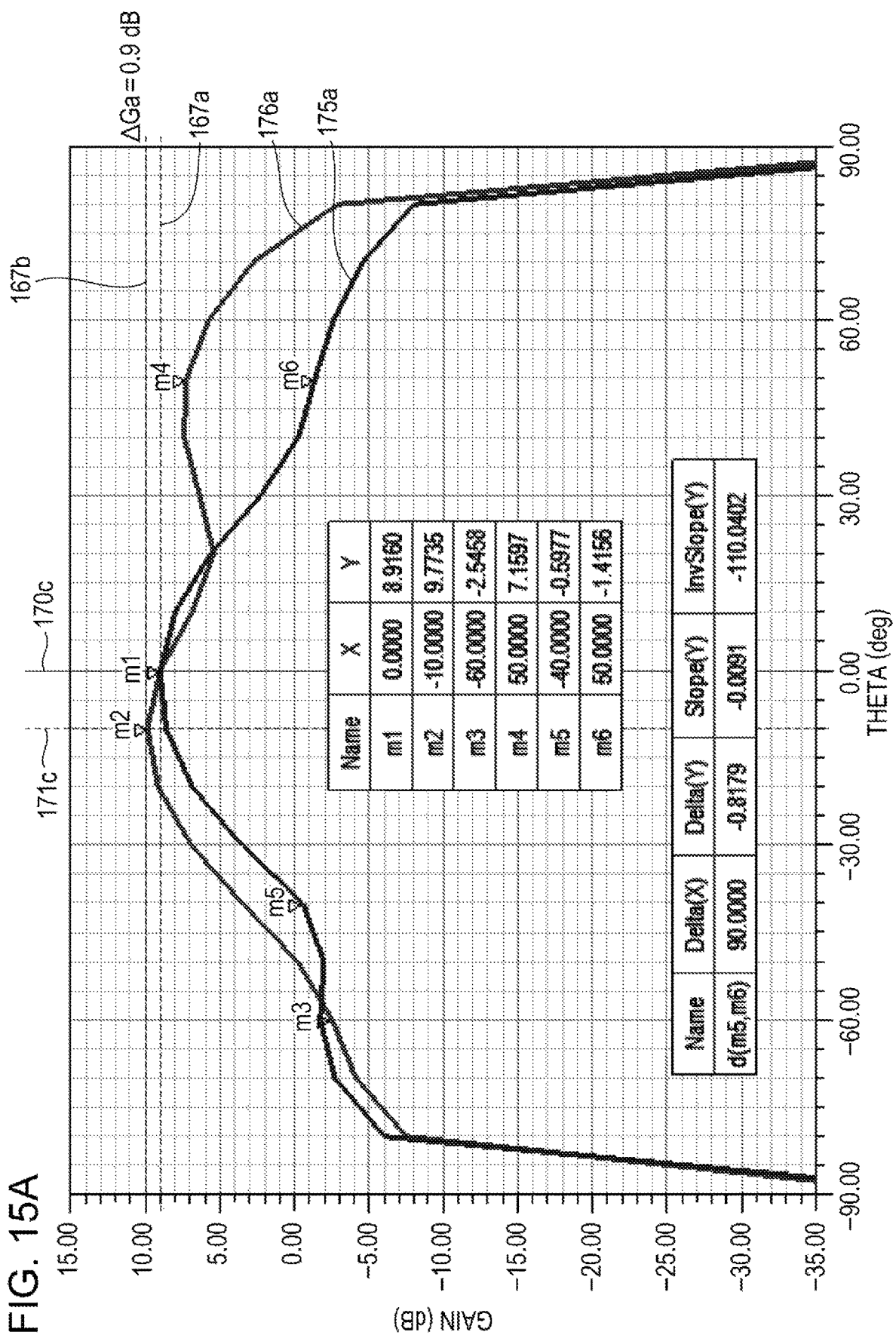
FIGS. 15A and 15B are diagrams illustrating a radiation pattern of antenna characteristics according to a fourth embodiment, in a case where a distance La between a power supply portion of a transmitting antenna portion and a power supply portion of a receiving antenna portion satisfies La>0.7λ (Lb=1 mm (0.08λ)
Figure 15B:
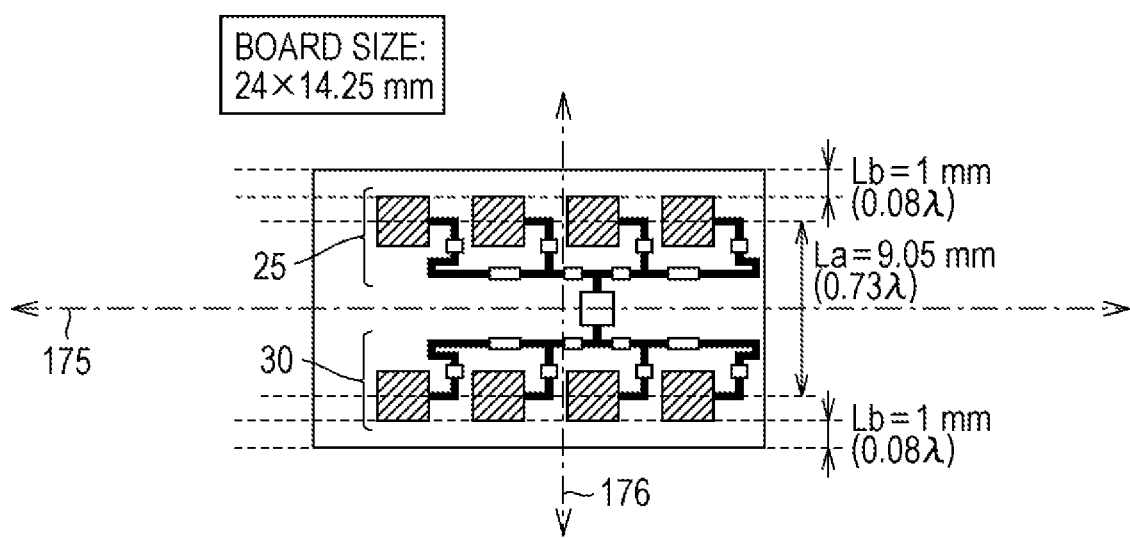
Figure 16A:
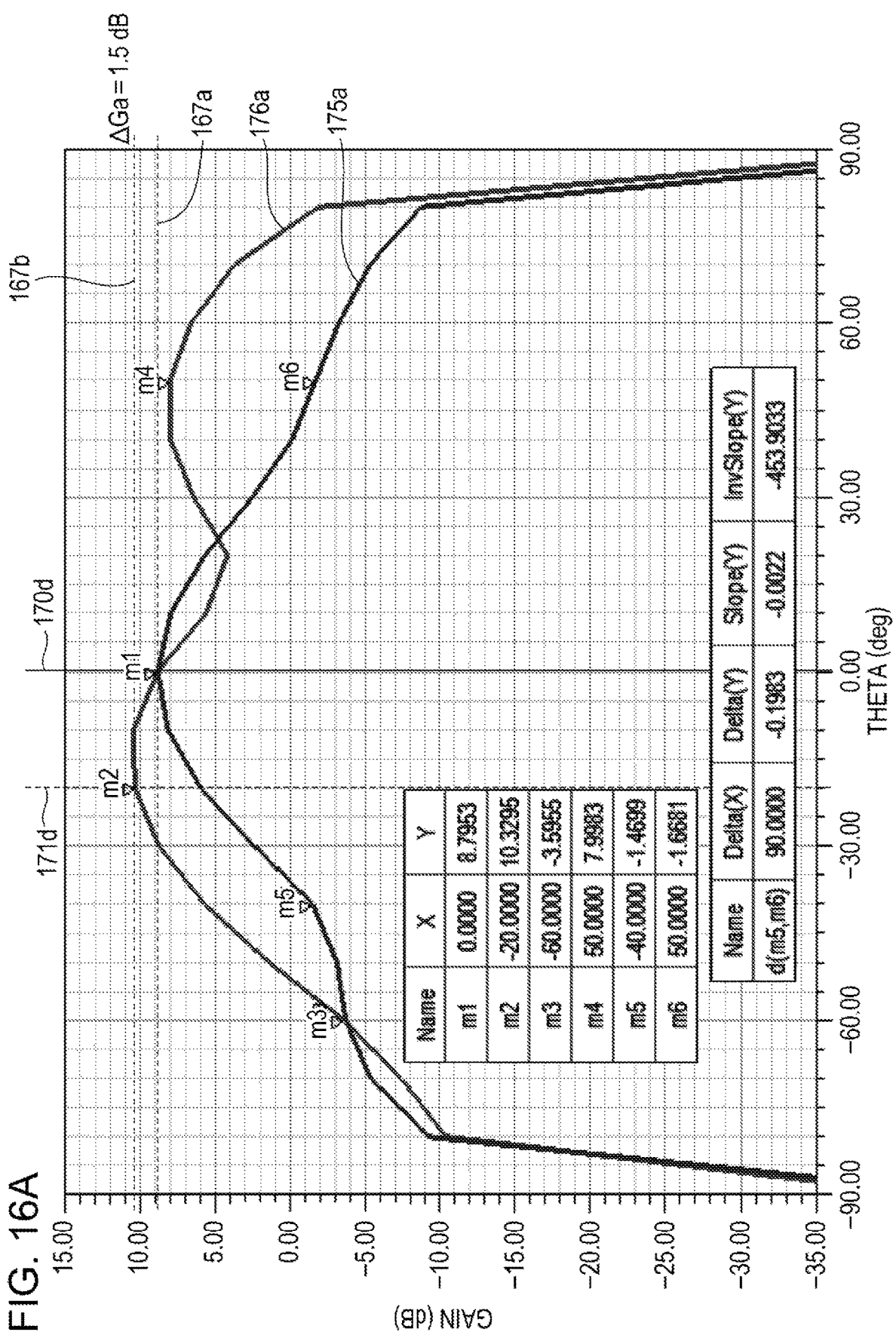
FIGS. 16A and 16B are diagrams illustrating a radiation pattern of antenna characteristics according to the fourth embodiment, in a case where the distance La between the power supply portion of the transmitting antenna portion and the power supply portion of the receiving antenna portion satisfies La>0.7λ (Lb=0.2 mm (λ/60)
Figure 16B:
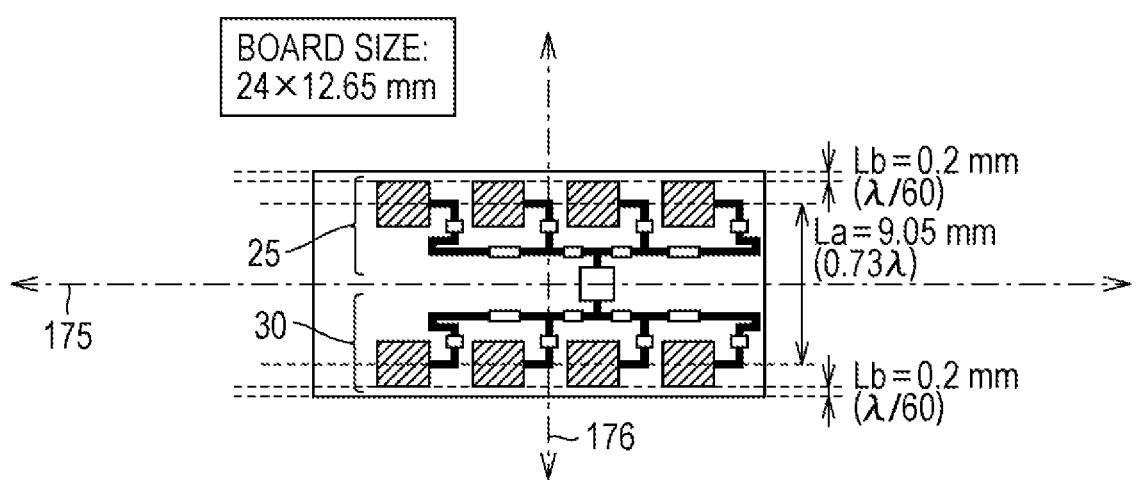

FIGS. 15A and 15B are diagrams illustrating a radiation pattern of antenna characteristics according to the fourth embodiment, in a case where distance La between the power supply portion of the transmitting antenna portion 25 and the power supply portion of the receiving antenna portion 30 satisfies La>0.7λ (Lb=1 mm (0.08λ)). FIGS. 16A and 16B are diagrams illustrating a radiation pattern of antenna characteristics according to the fourth embodiment, in a case where distance La between the power supply portion of the transmitting antenna portion 25 and the power supply portion of the receiving antenna portion 30 satisfies La>0.7λ (Lb=0.2 mm (λ/60)).

In the case of the example illustrated in FIGS. 15A and 15B, Lb=1 mm (0.08λ), which is relatively large in comparison with L>λ/60. In the directionality of the elevation angle direction 176 of antennas on the board 45, the difference in gain (ΔGa) between a frontal direction 170c in the normal direction of the board 45 and a peak direction 171c of antenna gain is 0.9 dB.

In the case of the example illustrated in FIGS. 16a and 16B where (Lb=0.2 mm (λ/60)), in the directionality of the elevation angle direction 176 of antennas on the board 45, the difference in gain (ΔGa) between a frontal direction 170d in the normal direction of the board 45 and a peak direction 171d of antenna gain is 1.5 dB. The difference in gain from the frontal direction is twice in antenna characteristics for transmitting/receiving as a whole for the transmitting antenna portion 25 and receiving antenna portion 30 formed on the board 45. Accordingly, the difference in gain is 1.8 dB in the example in FIGS. 15A and 15B, and is 3.0 dB in the example in FIGS. 16A and 16B. The gain in the frontal direction deteriorates around 3 dB as to gain in the peak direction in the flat antenna exemplified in FIGS. 16A and 16B, so the gain in the frontal direction is the lower limit value for operation as a transmitting/receiving flat antenna.

Dependence of Antenna Characteristics on Length Lc

Reducing a distance Lc between a side 60a of an antenna patch element portions 60 (patch side) that is on the opposite side from the power supply line (microstrip line 61) and the ground face 66 at the edge side of the board 45, to reduce the size of the high-frequency circuit block 101, has the following problems, in that 1) radiation from the rear face of the board increases, 2) gain at the frontal direction 170 in the normal direction of the board face deteriorates, and 3) the effects of a sharp beam are reduced by the directionality in the direction of array (azimuthal direction) of the four elements of the patch antenna becoming wider.

The distance Lc may be $\frac{1}{5}\lambda$ or longer in the present embodiment, to suppress such effects. Accordingly, the above-described effects can be reduced. Thus, deterioration of antenna gain can be reduced, and also the beam can be narrowed down in the direction of array of the four elements of the patch antenna.

Figure 17B:
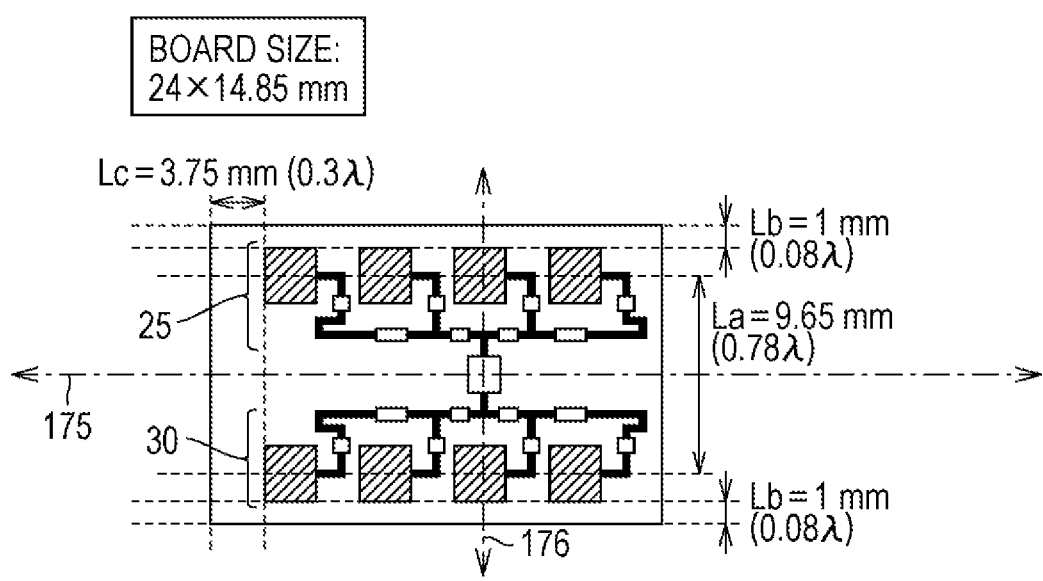
Figure 18A:
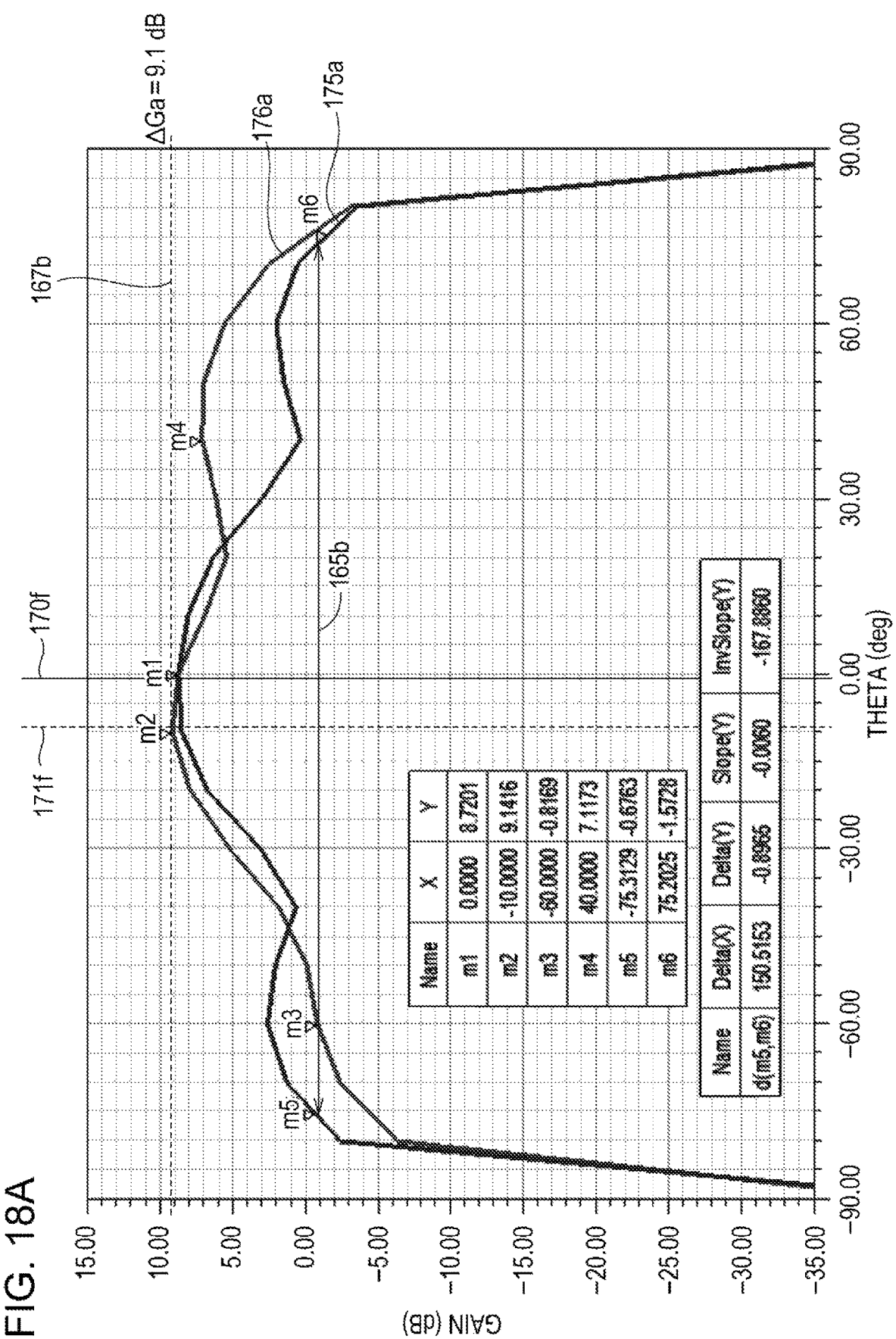
FIGS. 18A and 18B are diagrams illustrating a radiation pattern of antenna characteristics according to the fourth embodiment, in a case where the distance Lc between the patch edge and the ground face at the edge of the board is 1.0 mm (0.08λ)

As one example, in a case where the frequency is 24.1 GHz, the wavelength $\lambda$ in the air is 12.4 mm. FIG. 17A is a diagram illustrating a radiation pattern of antenna characteristics according to the fourth embodiment, in a case where the distance Lc between the patch side 60a and the ground face 66 at the edge side of the board 45 is 3 mm (0.3$\lambda$). FIG. 18A is a diagram illustrating a radiation pattern of antenna characteristics according to the fourth embodiment, in a case where the distance Lc between the patch side 60a and the ground face 66 at the edge side of the board 45 is 1.0 mm (0.08$\lambda$). With reference to FIGS. 17A through 18B, in a case where Lc=1.0 mm (0.08$\lambda$), the gain of the four elements of the patch antenna in the array direction (azimuthal direction 175) deteriorates 0.8 dB (1.6 dB in transmitting/receiving) as compared to a case where Lc=3.75 mm (0.3$\lambda$). Also, even in a case where narrow beam width where the 10 dB beam width is 70 degrees to 90 degrees is desired, the beam width broadens to around 150 degrees in the example illustrated in FIG. 18A (see double-headed arrow denoted by 165b). That is to say, the effects of narrowing the beam by arraying four elements are not obtained.

FIG. 11 is a diagram illustrating an example of a high-frequency circuit board. A pin header portion 190 may be formed on the board 45 in order to fix the board 45 to another board, an installation, or the like, as illustrated in FIG. 11. An area has to be provided on the board 45 to dispose a connecting terminal portion such as the pin header portion 190 or a connector or the like. Setting the distance Lc to be $\frac{1}{5}\lambda$ or longer allows sufficient space to be secured between the patch side 60a and the edge of the board 45. Accordingly, the region determined by this distance Lc can be used to dispose the above-described pin header portion 190 or a connector or the like.

Figure 18B:
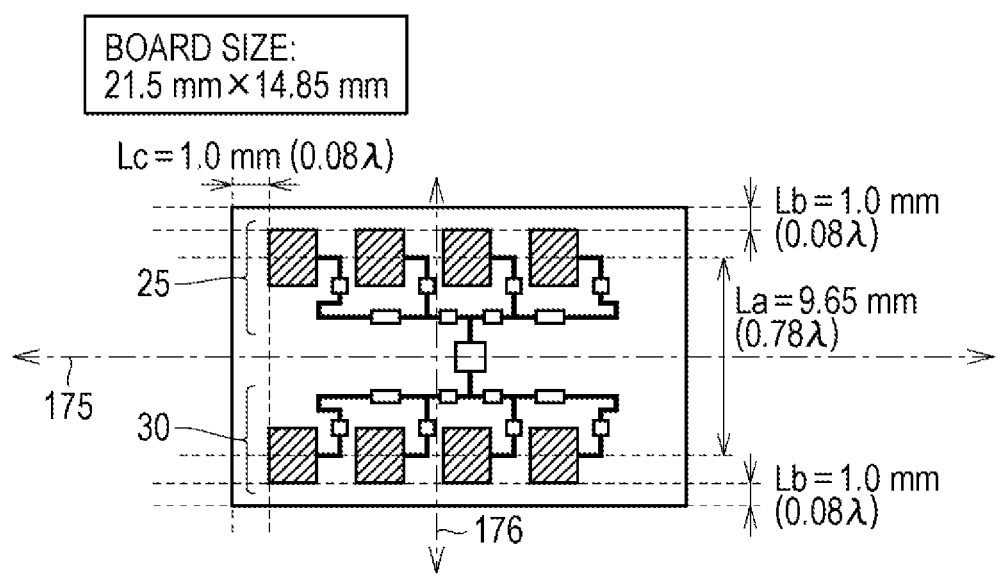

It can be seen from FIGS. 18A and 18B that appropriately selecting distances La, Lb, and Lc enables the frontal direction of the beam in the normal direction of the antenna board to match the peak direction of the beam in the fourth embodiment. The beam width at 10 dB is around 80 degrees at the azimuthal direction 175, and directionality characteristics around 140 degrees can be obtained at the elevation angle direction 176. That is to say, directionality characteristics that are clearly different can be obtained between the azimuthal direction 175 and elevation angle direction 176.

Figure 20:
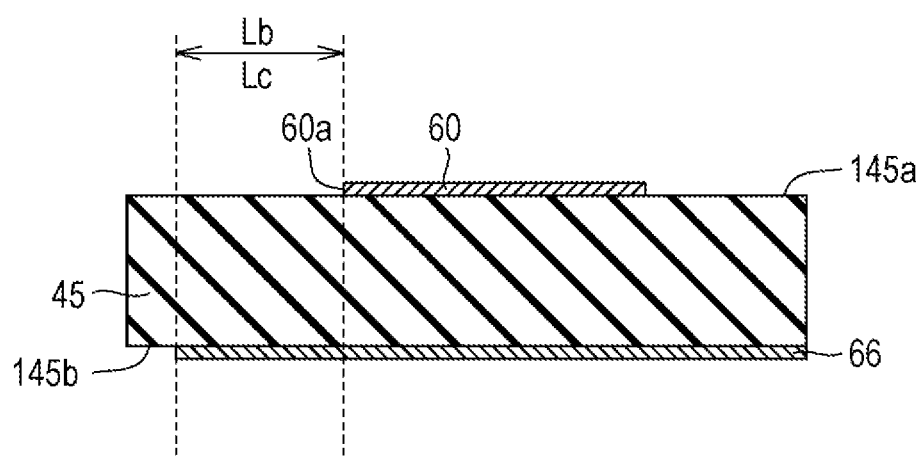
FIG. 20 is a diagram illustrating a configuration where part of a ground face on the rear face of the board does not reach the edge of the board.

In the above-described configuration, the ground face 66 is formed all the way to the board edge on the second face 145b of the board 45. However, an arrangement may be made where part of the ground face 66 does not reach the board edge, as illustrated in FIG. 20. In this case, the distance Lb and distance Lc can be defined as illustrated in FIG. 20. For example, Lb=Lc in this case.

Fifth Embodiment

Figure 19:
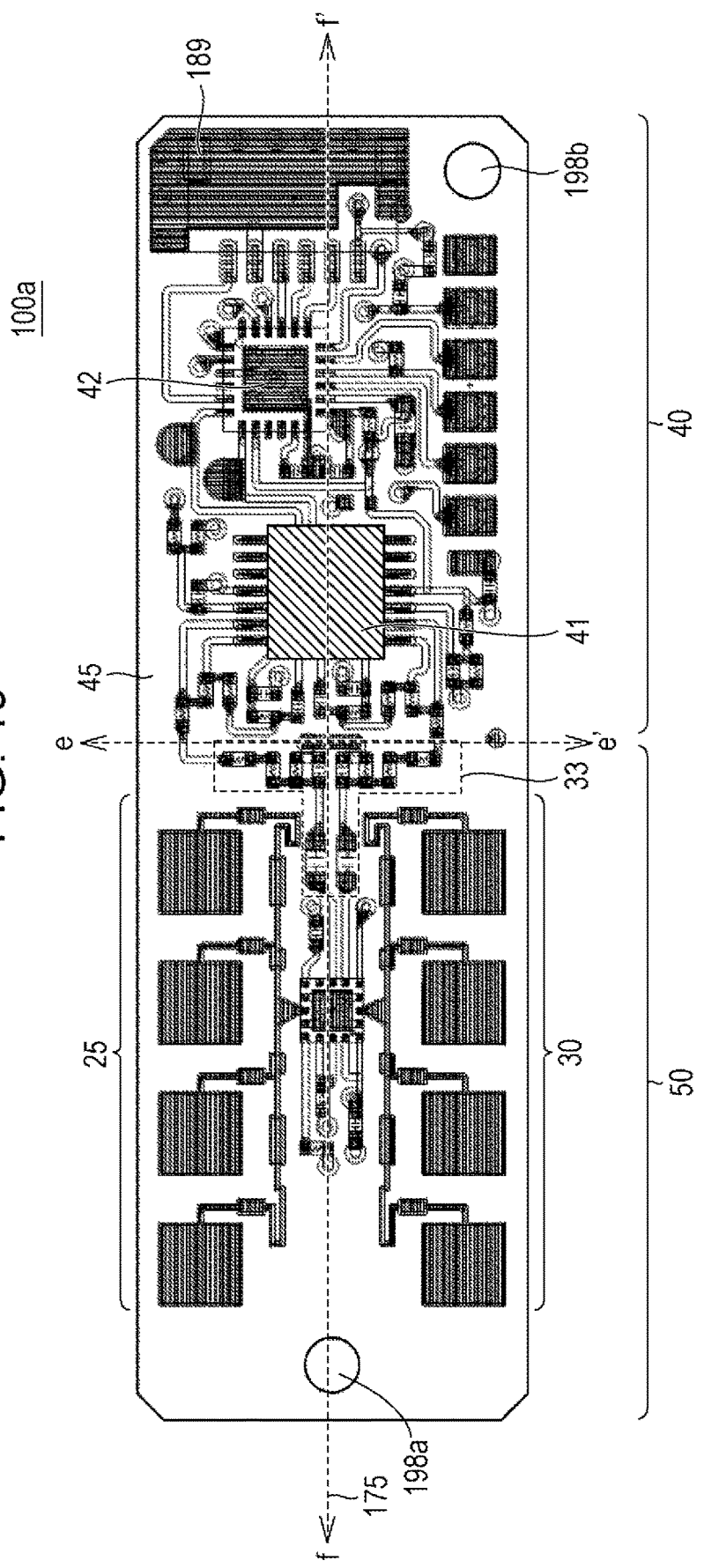
FIG. 19 is a diagram illustrating an example of a high-frequency circuit board.

A fifth embodiment of the present disclosure will be described below. Points of difference as to the fourth embodiment will be described below, with reference to FIG. 19 again. The high-frequency circuit block formed on the board 45 alone was shown in the fourth embodiment. FIG. 19 illustrates the configuration of the microwave device 100a including the high-frequency circuit portion 50 and signal processing unit 40.

The high-frequency circuit portion 50 includes the transmitting antenna portion 25 and receiving antenna portion 30, and the filter circuit portion 33 that is the output portion of the high-frequency circuit portion 50. The signal processing unit 40 is connected to the filter circuit 33. The signal processing unit 40 includes an analog amplifying/filtering unit 41 and a microcontroller unit (MCU) 42. The microcontroller unit 42 may include an AD converter. Digital output (e.g., universal asynchronous receiver-transmitter (UART) output) is output from a connector 189. Further, digital input (e.g., UART input) is also input via the connector 189 as control signals of the microwave device 100a.

The high-frequency circuit portion 50 and signal processing unit 40 are integrally formed on the same rectangular board (board 45) in the microwave device 100a. Accordingly, the board 45 is long in the direction f-f' illustrated in FIG. 19. In other words, the high-frequency circuit portion 50 and signal processing unit 40 may be arrayed in the longitudinal direction of the board 45.

The antenna radiation pattern forms illustrated in FIGS. 12A, 13A, 15A, 16A, 17A, and 18A i.e., the directionality of the azimuthal direction 175 (directionality in the direction of array of the four patch antenna elements) stabilizes by the board 45 being long in the f-f' direction as viewed from the transmitting antenna portion 25 and receiving antenna portion 30. Thus, a 10 dB beam width of around 70 degrees can be obtained. Accordingly, a clear difference in directionality can be created in comparison with the directionality of the 10 dB beam width in the elevation angle direction (10 dB beam width of approximately 140 degrees).

In the fifth embodiment, a region within the substrate face determined by the distance Lc can be secured, in the same way as with the fourth embodiment. Screw holes 198a and 198b may be formed, and the connector 189 that is a connecting terminal portion may be disposed, in this region. Accordingly, not only securing of antenna characteristics, but also attaching and fixing of the board 45 is facilitated. Further, a connection terminal portion (input/output interface portion) can be efficiently disposed within the board face.

Further, the length of the short side of the board 45 (length in the direction e-e') can be kept to the same length. The board 45 does not have to have a large short side, so a small microwave device can be realized. Accordingly, the microwave device 100a can be easily mounted in a frame or the like of a home electronic appliance (e.g., a television or PC).

Sixth Embodiment

A sixth embodiment of the present disclosure will be described below. Note that points of difference as to the fifth embodiment will be described below with reference to FIG. 21.

FIG. 21 is a diagram illustrating the configuration of a microwave device according to the sixth embodiment. The microwave device 100a in the sixth embodiment has a high-frequency circuit board 155 (equivalent to an antenna board) where the antennas and the high-frequency circuit portion 50 are formed, and a signal processing circuit board 156, as illustrated in FIG. 21.

In FIG. 21, line g-g' is a line illustrating the cross-sectional direction of the high-frequency circuit board 155. The high-frequency circuit board 155 and signal processing circuit board 156 are connected by pin header portions 190 and 191. The pin header portions 190 and 191 double as an input/output interface.

An arrangement where two connecting members such as the pin header portions 190 and 191 illustrated in FIG. 21 are disposed on the left and right of each board has conventionally been made, for stable physical connection between the two boards. Particularly, two pin header portions have to be disposed on both sides of the high-frequency circuit board 155. However, increased area of the high-frequency circuit board 155 for this leads to increased size and increased costs of the microwave device.

In the sixth embodiment, the signal processing unit 40 including various types of circuits 209 and 240 can be configured on a general-purpose board such as a glass epoxy board (FR4) or the like, unlike the high-frequency circuit portion 50. The signal processing unit 40 is configured on the motherboard along with other circuits, and just the high-frequency circuit portion 50 is configured as a dedicated board. Accordingly, the high-frequency circuit board 155 with small relative permittivity and small dielectric dissipation can be independently configured from the and signal processing circuit board 156. According to the sixth embodiment, the high-frequency circuit board and signal processing circuit board can each be optimized, so the performance of the microwave device can be raised by connection among boards of different types. The signal processing circuit board 156 is fixed to a desired position by screws 198, for example.

The pin header portion 190 is disposed only to one side of the high-frequency circuit board 155. The other side of the board may be supported by a resin attaching portion 192. The attaching portion 192 is a recessed resin member, and supports the high-frequency circuit board 155 being nipping the high-frequency circuit board 155 in a recessed portion.

Matching the height of the recess of the attaching portion 192 to the sum of the heights of the pin header portions 190 and 191 can enable the high-frequency circuit board 155 and signal processing circuit board 156 to be layered in the vertical direction, with a space (gap) of several mm to around 6 mm, for example, therebetween while maintaining the small size of the high-frequency circuit board 155. The resin attaching portion 192 may be fixed to the signal processing circuit board 156 by insertion into a hole formed in the signal processing circuit board 156, or may be fixed to the signal processing circuit board 156 by an adhesive agent or the like. Due to the gap of several mm to around 6 mm, the two boards can be vertically layered without insulating therebetween by resist or the like, even if the high-frequency circuit board 155 has a ground face, or a ground face and signal lines, formed on the rear face thereof. Further, unwanted radiation component from the rear face of the high-frequency circuit board 155 can be terminated at the ground portion by the signal processing circuit board 156 or the motherboard or the like.

Further, the transmitting antenna portion and receiving antenna portion may each be made up of one element, instead of four elements. Thus, the size of the high-frequency circuit board 155 can be made even smaller.

Note that the connector 189 and screw holes 198a and 198b illustrated in FIG. 19 may be applied to the high-frequency circuit board 155 instead of the pin header portion 191, as a modification of the present embodiment. Connection may be made from the connector 189 to the signal processing circuit board 156 existing at another location, or to the motherboard where the signal processing unit 40 is configured, via a connection cable that is omitted from illustration. According to such a configuration, the high-frequency circuit board 155 can be disposed in places where there is no space to spare. Accordingly, the microwave device can be employed as a person/motion/vital sensor such as illustrated in a seventh embodiment (see below).

Seventh Embodiment

A seventh embodiment will be described below. An example where the microwave device 100a according to the sixth embodiment has been mounted in the bidet toilet seat 250 will be described in the present embodiment.

Figure 22A:
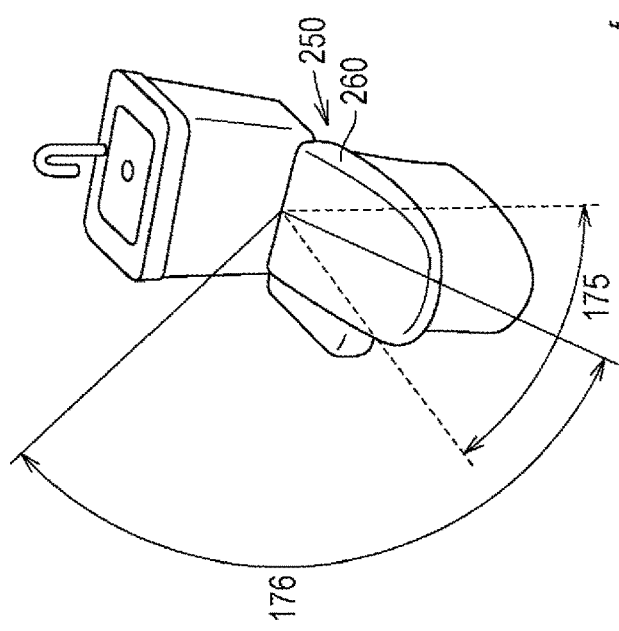
FIGS. 22A and 22B are diagrams illustrating an example where the microwave device according to the sixth embodiment is installed in a bidet toilet seat.
Figure 22B:
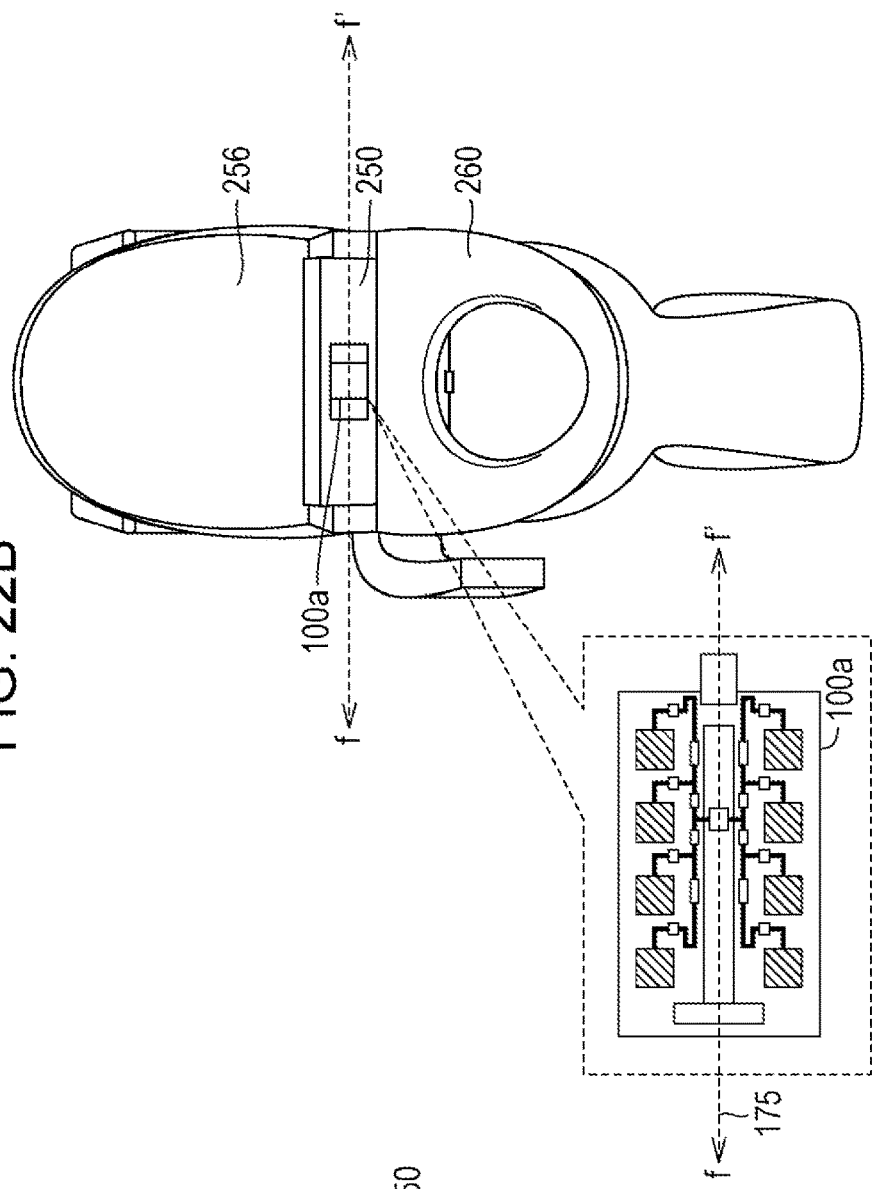
Figure 23:
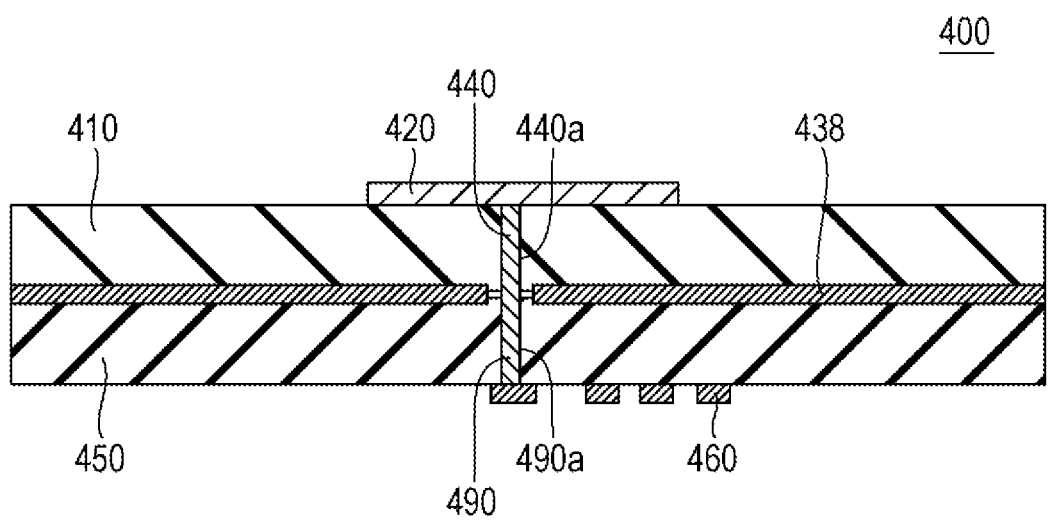
FIG. 23 is a diagram illustrating a schematic configuration of a disclosure disclosed in Japanese Unexamined Patent Application Publication 7-66627.
Figure 24A:
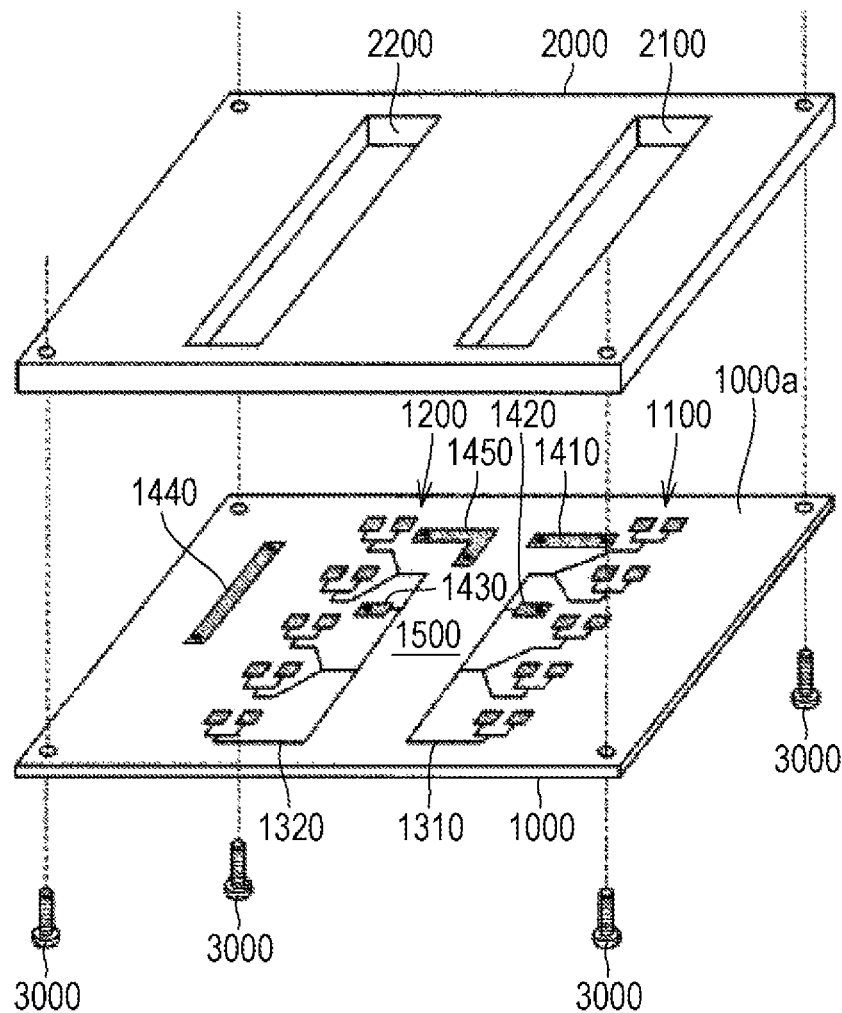
FIGS. 24A and 24B are diagrams illustrating a schematic configuration of a disclosure disclosed in Japanese Unexamined Patent Application Publication 2007-13531.
Figure 24B:
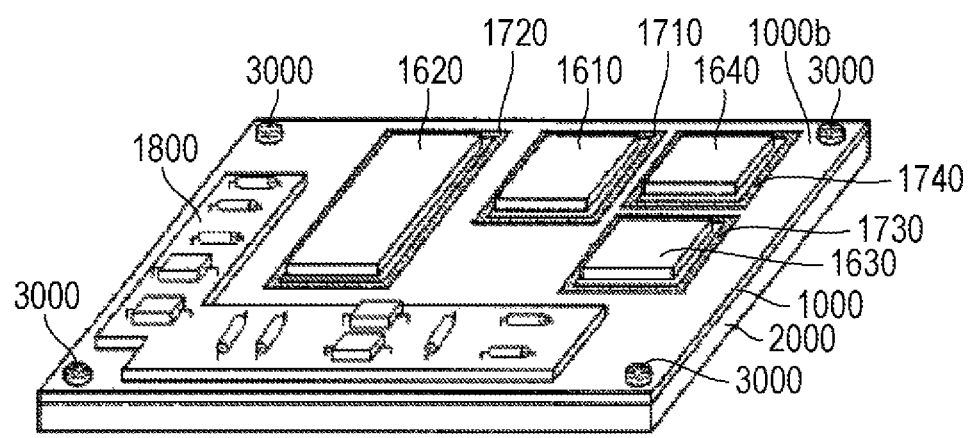

As illustrated in FIG. 22, the microwave device 100a is embedded in a resin portion of the main unit (toilet seat) of the bidet toilet seat 250. The microwave device 100a has the four-element transmitting antenna portion 25 and receiving antenna portion 30, and is mounted to the main unit of the bidet toilet seat 250 with the f-f' direction being the horizontal direction (azimuthal direction 175), as illustrated in FIG. 22. The microwave device 100a is covered by a resin member, which is advantageous in that the microwave device 100a is not visible from outside of the bidet toilet seat 250. Transmission waves Mt and reception waves Mr (see FIG. 1) of the microwave device 100a are microwaves, and are transmitted through the resin member. The microwave device 100a performs sensing by transmitting and receiving microwaves. When a person approaches the bidet toilet seat 250 from around three meters away, the microwave device 100a senses the approaching action of the person. The bidet lid of the bidet toilet seat 250 is automatically opened due to the sensing by the microwave device 100a. The approaching action can also be determined by increase in IQ amplitude value or advance of IQ phase of the microwave device 100a.

A case of a person approaching the bidet toilet seat 250 from around three meters away will be considered. The antenna beam width in the present embodiment is the 10 dB beam width. The angle of the azimuthal direction 175 in the horizontal direction is preferably 90 degrees or less, and particularly preferably is around 70 to 80 degrees, since the width of a person is 0.5 meters or less, which is small. On the other hand, the height of an adult is around 1.7 meters, so the directionality of the elevation angle direction 176 is desirably maximally wide. However, an angle where the radio wave beam does not directly strike the ceiling, floor, or the like, is desirable. Accordingly, the elevation angle direction 176 is desired to be a directionality of around 100 to 150 degrees. Thus, the microwave device 100a is installed so as to be able to obtain directionality around 70 to 80 degrees in the azimuthal direction 175, and around 130 to 140 degrees in the elevation angle direction 176.

Note that in the above description, the beam width of antenna characteristics has been described as being the 10 dB width, and an angle range where transmission and reception power each are 1/10. The microwave device 100a emits radio wave beams to a person, and receives radio wave beams reflected from the person, thereby detecting whether or not there is a person. The above description demonstrates the range of directionality of radio waves where such characteristics of the microwave device 100*a* can be realized.

As described above, attaching the microwave device 100*a* to the bidet toilet seat 250 and narrowing the directionality in the azimuthal direction and elevation angle direction enables sensing of people in a sure manner with fewer erroneous detections. Particularly, narrowing down the directionality in the azimuthal direction enables affecting surrounding radio waves and being affected by surrounding radio waves to be reduced, even in a case where multiple of the above-described bidet toilet seats 250 are installed in public restrooms or the like.

Accordingly, the microwave device 100*a* according to the present embodiment can monitor body movement of people in a state of sitting on the toilet seat or in a state of standing. When the person leaves the toilet seat, the lid 256 of the bidet toilet seat 250 can be closed. In this case, the microwave device 100*a* can determine that the person has left the toilet seat, by reduction on body movement IQ amplitude value or inversion of IQ phase (opposite phase to the case of approaching). Additionally, pulse or respiratory components can be extracted from the hips of the person in a seated state on the toilet set by the microwave device 100*a* disposed in the main body of the bidet toilet seat 250.

The present disclosure is not restricted to the above-described embodiments. Various modifications may be made within the scope laid forth in the Claims, and embodiments obtained by appropriately combining technical measures disclosed in different embodiments are also encompassed by the technical scope of the present disclosure. Further, new technical features can be formed by combining technical measures disclosed in different embodiments.

The present disclosure can be used in a communication device, radar device, and so forth, using high-frequency waves such as microwaves, millimeter waves, and so forth. Particularly, the present disclosure is useful in a motion detection sensor, living body sensor, and human sensor.

The present disclosure contains subject matter related to that disclosed in Japanese Priority Patent Application JP 2018-041895 filed in the Japan Patent Office on Mar. 8, 2018 and Japanese Priority Patent Application JP 2018-159841 filed in the Japan Patent Office on Aug. 29, 2018, the entire contents of which are hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A microwave device, comprising:
a first board having a first face and a second face;
a transmitting antenna portion provided on the first face;
a receiving antenna portion provided on the first face;
a high-frequency circuit portion that is provided on the first face, and that is connected to the transmitting antenna portion and the receiving antenna portion, the high-frequency circuit portion being disposed between the transmitting antenna portion and the receiving antenna portion and including a first ground face, a circuit part, and a line; and
a second ground face that is provided on the second face of the first board and is shared by the transmitting antenna portion, the receiving antenna portion, and the high-frequency circuit portion,
wherein a via hole is provided connecting the first ground face and the second ground face of the high-frequency circuit portion,
and wherein the first ground face, the second ground face, and the via hole, form a ground face that is shared by the transmitting antenna portion, the receiving antenna portion, and the high-frequency circuit portion.

2. The microwave device according to claim 1,
wherein the second ground face of the first board is electrically connected to the ground face of a second board and another metal part other than a metal part of the first board and the second board,
and wherein the ground face of the second board and the other metal part are the transmitting antenna portion and the receiving antenna portion, or a shared ground face of the transmitting antenna portion and the receiving antenna portion.

3. The microwave device according to claim 1,
wherein a high-frequency transmission line of the high-frequency circuit portion is configured of a microstrip line and ground coplanar line,
wherein the transmitting antenna portion and the receiving antenna portion, or a shared electric power supply line of the transmitting antenna portion and the receiving antenna portion, is configured of a microstrip line,
wherein part of the high-frequency circuit portion includes a ground coplanar line,
wherein the high-frequency circuit unit includes a converting unit to convert the microstrip line and the ground coplanar line,
and wherein part of the ground face is removed at the second face of the first board, and signal wiring for the high-frequency circuit portion is formed at the region where the ground face has been removed.

4. The microwave device according to claim 1,
wherein the first board is a board having relative permittivity of 4 or higher.

5. A microwave device, comprising:
a first board having a first face and a second face;
a transmitting/receiving antenna portion that is provided on the first face and that is shared by the transmitting antenna portion and the receiving antenna portion, and that has an electric power supply unit;
a high-frequency circuit portion that is provided on the first face along with the transmitting/receiving antenna portion and that is connected to the transmitting/receiving antenna portion, the high-frequency circuit portion including a first ground face, a circuit part, a line, a transmission terminal, and a reception terminal; and
a second ground face that is provided on the second face of the first board and is shared by the transmitting/receiving antenna portion and the high-frequency circuit portion,
wherein the electric power supply unit of the transmitting/receiving antenna portion and the transmission terminal and reception terminal of the high-frequency circuit portion are connected by a power coupler having inter-terminal isolation or a branch line coupler having directionality,
wherein a via hole is provided connecting the first ground face and the second ground face of the high-frequency circuit portion,
and wherein the first ground face, the second ground face, and the via hole, form a ground face that is shared by the transmitting/receiving antenna portion and the high-frequency circuit portion.

6. The microwave device according to claim 5,
wherein the second ground face of the first board is electrically connected to the ground face of a second board and another metal part other than a metal part of the first board and the second board,
and wherein the ground face of the second board and the other metal part are the transmitting antenna portion and the receiving antenna portion, or a shared ground face of the transmitting antenna portion and the receiving antenna portion.

7. The microwave device according to claim 5,
wherein a high-frequency transmission line of the high-frequency circuit portion is configured of a microstrip line and ground coplanar line,
wherein the transmitting antenna portion and the receiving antenna portion, or a shared electric power supply line of the transmitting antenna portion and the receiving antenna portion, is configured of a microstrip line,
wherein part of the high-frequency circuit portion includes a ground coplanar line,
wherein the high-frequency circuit unit includes a converting unit to convert the microstrip line and the ground coplanar line,
and wherein part of the ground face is removed at the second face of the first board, and signal wiring for the high-frequency circuit portion is formed at the region where the ground face has been removed.

8. The microwave device according to claim 5,
wherein the first board is a board having relative permittivity of 4 or higher.

9. A microwave device, comprising:
a first board having a first face and a second face;
a transmitting antenna portion provided on the first face;
a receiving antenna portion provided on the first face;
a high-frequency circuit portion that is provided on the first face, and that is connected to the transmitting antenna portion and the receiving antenna portion, the high-frequency circuit portion being disposed between the transmitting antenna portion and the receiving antenna portion and including a first ground face, a circuit part, and a line; and
a second ground face that is provided on the second face of the first board and is shared by the transmitting/receiving antenna portion and the high-frequency circuit portion,
wherein the transmitting antenna portion and receiving antenna portion are configured with an interval between respective power supply points is $0.7\lambda$ to $2\lambda$ (where $\lambda$ represents the wavelength of microwaves in air),
wherein a via hole is provided connecting the first ground face and the second ground face of the high-frequency circuit portion,
and wherein the first ground face, the second ground face, and the via hole, form a ground face that is shared by the transmitting antenna portion, the receiving antenna portion, and the high-frequency circuit portion.

10. The microwave device according to claim 9,
wherein the transmitting antenna portion and receiving antenna portion each include a microstrip patch antenna,
where the microstrip patch antenna is orthogonal to a side of the power supply unit, and has one side close to an edge of the first board, with the one side being distanced from a ground conductor at an edge of the second face of the first board by $\lambda/60$ or more.

11. The microwave device according to claim 10,
wherein the first board has a region at a side of a patch antenna situated on the opposite side from the electric power supply unit of the microstrip patch antenna,
and wherein a through hole through which a screw for fixing the first board is formed in the region, or a connecting terminal portion is formed in the region.

12. The microwave device according to claim 9,
wherein the transmitting antenna portion and receiving antenna portion each include a plurality of microstrip patch antennas,
where the plurality of microstrip patch antennas are arrayed in one row in a direction of the power supply unit and make up an array antenna.

13. The microwave device according to claim 12,
wherein a patch antenna that is closest to the edge of the first board out of the plurality of microstrip patch antennas has a second side situated on an opposite side from the electric power supply unit is distanced from an edge a ground conductor at an edge of the second face of the first board by $\frac{1}{5}\lambda$ or more.

14. The microwave device according to claim 9, further comprising:
a signal processing circuit disposed on the first face of the first board,
wherein the high-frequency circuit portion and the signal processing circuit are arrayed following a longitudinal direction of the first face of the first board.

15. The microwave device according to claim 9, further comprising:
a signal processing circuit portion that processes signals converted into low-frequency signals by the high-frequency circuit portion;
a second board on which the signal processing circuit portion is disposed;
a resin platform that is provided on the second board and that supports the first board with the first board and the second board layered in the vertical direction; and
a pin that electrically connects the high-frequency circuit portion and the signal processing circuit portion.

* * * * *